United States Patent
Yokoyama

(10) Patent No.: US 11,875,947 B2
(45) Date of Patent: Jan. 16, 2024

(54) CAPACITIVE UNITS AND METHODS OF FORMING CAPACITIVE UNITS

(71) Applicant: Micron Technology, Inc., Boise, ID (US)

(72) Inventor: Yuichi Yokoyama, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 362 days.

(21) Appl. No.: 17/228,411

(22) Filed: Apr. 12, 2021

(65) Prior Publication Data

US 2022/0328249 A1 Oct. 13, 2022

(51) Int. Cl.
| | |
|---|---|
| H01G 4/30 | (2006.01) |
| H01L 27/10 | (2006.01) |
| H01G 4/10 | (2006.01) |
| H01G 4/005 | (2006.01) |

(52) U.S. Cl.
CPC ............. *H01G 4/30* (2013.01); *H01G 4/005* (2013.01); *H01G 4/10* (2013.01); *H01L 27/101* (2013.01)

(58) Field of Classification Search
CPC . H01G 4/30; H01G 4/005; H01G 4/10; H01L 27/101
USPC .................................. 361/301.4, 303, 321.1
See application file for complete search history.

(56) References Cited

U.S. PATENT DOCUMENTS

| | | | |
|---|---|---|---|
| 2007/0090429 A1* | 4/2007 | Chien | H01L 28/60 257/296 |
| 2008/0158776 A1* | 7/2008 | Chen | H01L 28/60 29/25.03 |
| 2019/0164985 A1* | 5/2019 | Lee | H10B 12/05 |

OTHER PUBLICATIONS

Lee et al., U.S. Appl. No. 16/943,494, filed Jul. 30, 2020, titled "Digit Line and Body Contact for Semiconductor Devices", 87 pages.
Lee et al., U.S. Appl. No. 17/079,745, filed Oct. 26, 2020, titled "Vertical Digit Lines for Semiconductor Devices", 125 pages.

* cited by examiner

*Primary Examiner* — Arun Ramaswamy
(74) *Attorney, Agent, or Firm* — Wells St. John P.S.

(57) ABSTRACT

Some embodiments include a capacitive unit having two or more capacitive tiers. Each of the capacitive tiers has first electrode material arranged in a configuration having laterally-extending first segments and longitudinally-extending second segments. The first and second segments join at intersection-regions. The first electrode material of the first and second segments is configured as tubes. The capacitive tiers are together configured as a stack having a first side. The first electrode material caps the tubes along the first side. Capacitor dielectric material lines the tubes. Second electrode material extends into the lined tubes. Columns of the second electrode material extend vertically through the capacitive tiers and are joined with the second electrode material within the lined tubes. A conductive plate extends vertically along the first side of the stack and is directly against the first electrode material. Some embodiments include methods of forming integrated assemblies.

21 Claims, 29 Drawing Sheets

Memory Region

Memory Region

Memory Region

Memory Region

Memory Region

CAPACITIVE UNITS AND METHODS OF FORMING CAPACITIVE UNITS

TECHNICAL FIELD

Integrated assemblies. Capacitive units. Methods of forming capacitive units. Methods of forming integrated assemblies.

BACKGROUND

Integrated assemblies may utilize circuits comprising resistors and capacitors (RC circuits) to stabilize power throughout the assemblies. For instance, the RC circuits may be provided peripherally to a memory array (e.g., a DRAM array), and may be utilized to modify the rise speed of power supply voltages, alleviate oscillation of the voltages, and otherwise smooth the voltages.

The RC circuits may utilize capacitive units (assemblies) to provide the desired capacitance, with an individual capacitive unit comprising multiple capacitors. In some applications, the capacitors of the RC circuits may be referred to as "FAT CAPS".

It is desired to develop new configurations of capacitive units, with such configurations preferably being suitable for utilization in highly-integrated assemblies.

Integrated assemblies may include memory. An example memory configuration 1200 is shown in FIG. 1. Transistors (access devices) 1206 include horizontally-extending segments of semiconductor material 1204, with such segments including source/drain regions 1238 and 1240, and including channel regions 1242. Capacitors 1208 are coupled with the transistors 1206 through conductive interconnects 1244. In some applications, the conductive interconnects may be considered to be part of the capacitors, and may, for example, be considered to be part of the storage nodes of such capacitors.

Memory cells 1210 comprise the transistors 1206 and the capacitors 1208. The memory cells are arranged within the memory configuration (memory array) 1200, with such array having rows 1224 extending along an illustrated z-axis direction, and having columns 1246 extending along an illustrated x-axis direction. Digit lines 1212 extend along the columns 1246, and are coupled with the source/drain regions 1238 of the transistors 1206. Wordlines 1214 extend along the rows 1224 of the memory array, and are adjacent to the channel regions 1242 of the transistors 1206. In the illustrated embodiment, each of the wordlines comprises two segments, with such segments being on opposing sides of the channel regions 1242. In other embodiments, the wordlines may comprise other suitable configurations, and may, for example, comprise only a single component on one side of a channel region, may comprise gate-all-around configurations, etc.

The wordlines 1214 are generally spaced from the channel regions 1242 by gate dielectric material (e.g., silicon dioxide), but such gate dielectric material is not shown in FIG. 1 in order to simplify the drawing.

The body regions (channel regions) 1242 of the transistors 1206 are coupled with a conductive plate 1248. Such plate may be utilized to enable excess carriers (e.g., holes) to drain from the body regions 1242 during some operational modes of the memory cells 1210.

FIG. 2 shows a cross-sectional side view of the assembly 1200 of FIG. 1 along the y-axis direction, and diagrammatically illustrates some of the structures described above with reference to FIG. 1. The transistors 1206 are shown to extend horizontally along the y-axis direction. The wordlines 1214 are shown to extend vertically along the z-axis direction, and the digit lines 1212 are shown to extend horizontally in and out of the page relative to the cross-sectional view of FIG. 2. The conductive plates 1248 (FIG. 1) are not shown in FIG. 2 in order to simplify the drawing.

The capacitors 1208 of laterally neighboring memory cells 1210 are shown to share a plate electrode 1250 in the memory configuration 1200 of FIG. 2.

A base 1216 supports components of the memory configuration 1200. Such base may comprise semiconductor material; and may, for example, comprise, consist essentially of, or consist of monocrystalline silicon. The base 1216 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 1216 may correspond to a semiconductor substrate containing one or more materials associated with integrated circuit fabrication. Such materials may include, for example, one or more of refractory metal materials, barrier materials, diffusion materials, insulator materials, etc.

Another example memory configuration 1300 is shown in FIG. 3. Transistors (access devices) 1306 include horizontally-extending segments of semiconductor material 1304, with such segments including source/drain regions 1338 and 1340, and including channel regions 1342. Capacitors 1308 are coupled with the transistors 1306 through conductive interconnects 1344. In some applications, the conductive interconnects may be considered to be part of the capacitors, and may, for example, be considered to be part of the storage nodes of such capacitors.

Memory cells 1310 comprise the transistors 1306 and the capacitors 1308. The memory cells are arranged within the memory configuration (memory array) 1300. Digit lines 1312 extend along columns of the memory array and are coupled with the source/drain regions 1338 of the transistors 1306. The digit lines extend vertically along a z-axis direction.

Wordlines 1314 extend along the rows of the memory array, and are adjacent to the channel regions 1342 of the transistors 1306. The wordlines 1314 are spaced from the channel regions 1342 by gate dielectric material 1305.

The body regions (channel regions) 1342 of the transistors 1306 are coupled with a conductive plate 1348. Such plate may be utilized to enable excess carriers (e.g., holes) to drain from the body regions 1342 during some operational modes of the memory cells 1310.

FIG. 4 shows a cross-sectional side view of the assembly 1300 of FIG. 3 along the x-axis direction, and diagrammatically illustrates some of the structures described above with reference to FIG. 3. The transistors 1306 are shown to extend horizontally along the x-axis direction. The digit lines 1312 are shown to extend vertically along the z-axis direction, and the wordlines 1314 are shown to extend horizontally in and out of the page relative to the cross-sectional view of FIG. 4.

The capacitors 1308 of laterally neighboring memory cells 1310 are shown to share a plate electrode 1350.

The illustrated components of the memory configuration 1300 are shown to be supported by a base 1316. Such base may be a semiconductor substrate.

A continuing goal during the fabrication of integrated assemblies is to increase packing density and to thereby conserve valuable semiconductor real estate. It is desired to develop improved capacitive units which may be highly integrated. It is further desired for such capacitive units to be suitable for being cost-effectively incorporated into assemblies comprising integrated memory.

BRIEF DESCRIPTION OF THE DRAWINGS

FIGS. 6A-1 and 6A-2 are diagrammatic cross-sectional side views of example embodiments of capacitive units.

FIG. 9A-1 is a diagrammatic cross-sectional side view of an example memory region of an example integrated assembly at an example process stage that may occur simultaneously with the process stage of FIGS. 9A and 9B.

FIG. 10A-1 is a diagrammatic cross-sectional side view of an example memory region of an example integrated assembly at an example process stage that may occur simultaneously with the process stage of FIGS. 10A and 10B.

FIG. 11A-1 is a diagrammatic cross-sectional side view of an example memory region of an example integrated assembly at an example process stage that may occur simultaneously with the process stage of FIGS. 11A and 11B.

FIG. 12A-1 is a diagrammatic cross-sectional side view of an example memory region of an example integrated assembly at an example process stage that may occur simultaneously with the process stage of FIGS. 12A and 12B.

FIG. 13A-1 is a diagrammatic cross-sectional side view of an example memory region of an example integrated assembly at an example process stage that may occur simultaneously with the process stage of FIGS. 13A and 13B.

DETAILED DESCRIPTION OF THE ILLUSTRATED EMBODIMENTS

Some embodiments include three-dimensional configurations of capacitive units. Some embodiments include methods of forming the capacitive units. In some embodiments, fabrication steps utilized during formation of the capacitive units may occur simultaneously with fabrication steps utilized to form integrated memory components. Such may enable savings of time and material, which may lead to cost-savings. Example embodiments are described with reference to FIGS. 5-13.

Figure 5:
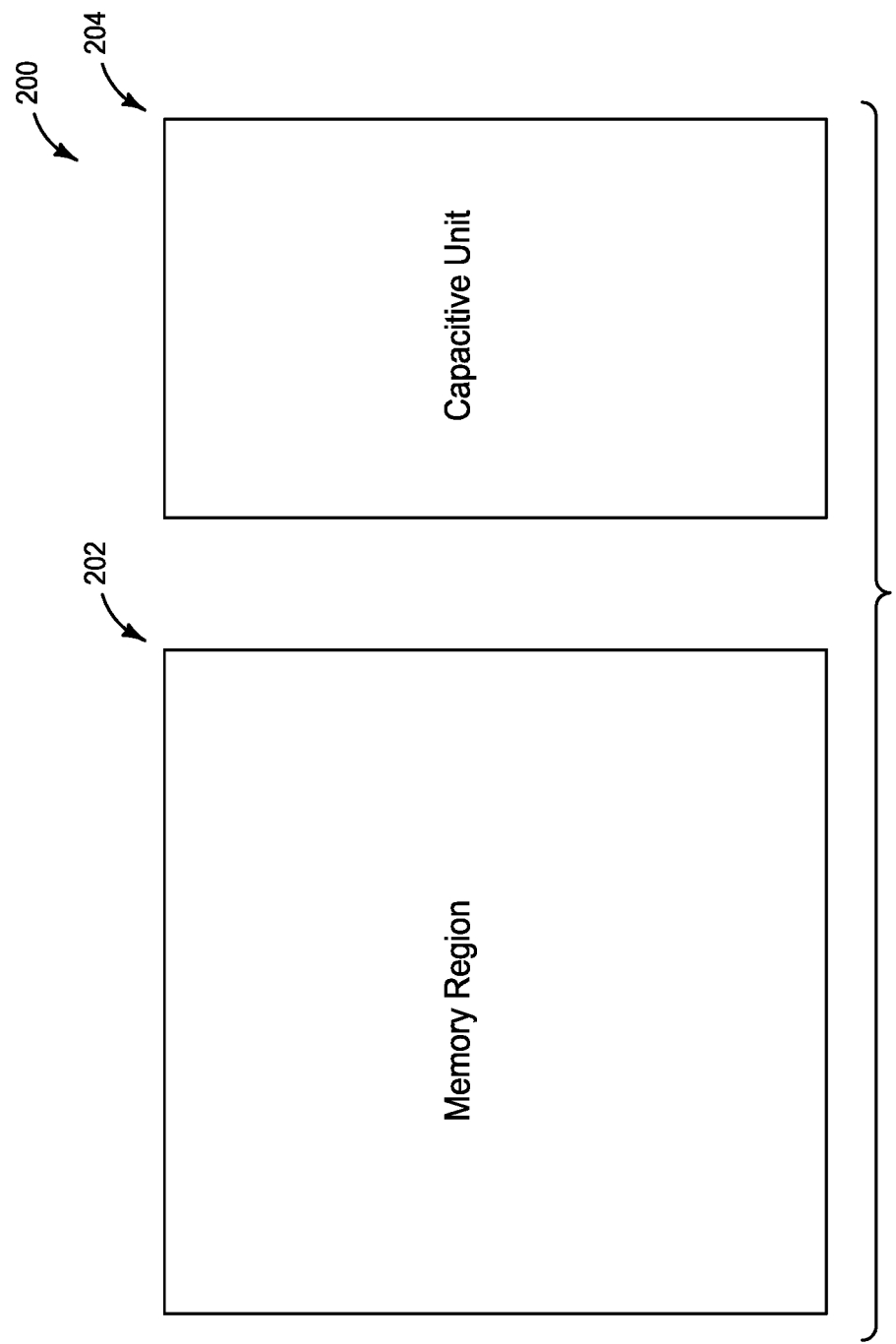
FIG. 5 is a diagrammatic illustration of an example integrated assembly having a memory region and a capacitive unit.

FIG. 5 illustrates regions 202 and 204 of an example integrated assembly 200. The region 202 is a memory region. The memory region may comprise DRAM (dynamic random-access memory) and/or any other suitable memory. Wordlines and digit lines may extend across memory cells of the memory region. The term "sense/access line" may be utilized as a term which is generic for both wordlines and digit lines. In some applications, the memory region may comprise one or more of the configurations described above with reference to FIGS. 1-4. Specifically, the memory region may comprise memory cells having laterally-extending capacitors, and may comprise vertically-extending sense/access lines associated with the memory cells.

The region 204 includes a capacitive unit. The capacitive unit may be considered to be proximate to the memory region 202. The capacitive unit may be incorporated into an RC circuit and may be utilized for any of the various applications described above in the Background section (e.g., may be utilized to alleviate oscillation of voltages and/or to otherwise smooth voltages).

The capacitive unit may be provided on a same chip as the memory region, or may be provided off-chip relative to the memory region.

Example embodiments of capacitive units are described below, as are example methods of forming the capacitive units. In some applications, it may be advantageous for the capacitive units described herein to be formed on a same chip as a memory region, and for one or more components of the capacitive units to be formed simultaneously with one or more components of the memory region. However, it is to be understood that the capacitive units described herein may also be formed as part of integrated circuits containing sensors, logic, and/or other integrated devices, either in addition to, or alternatively to, memory. Also, it is to be understood that the capacitive units described herein may be provided either on-chip or off-chip relative to other integrated devices.

Figure 6A:
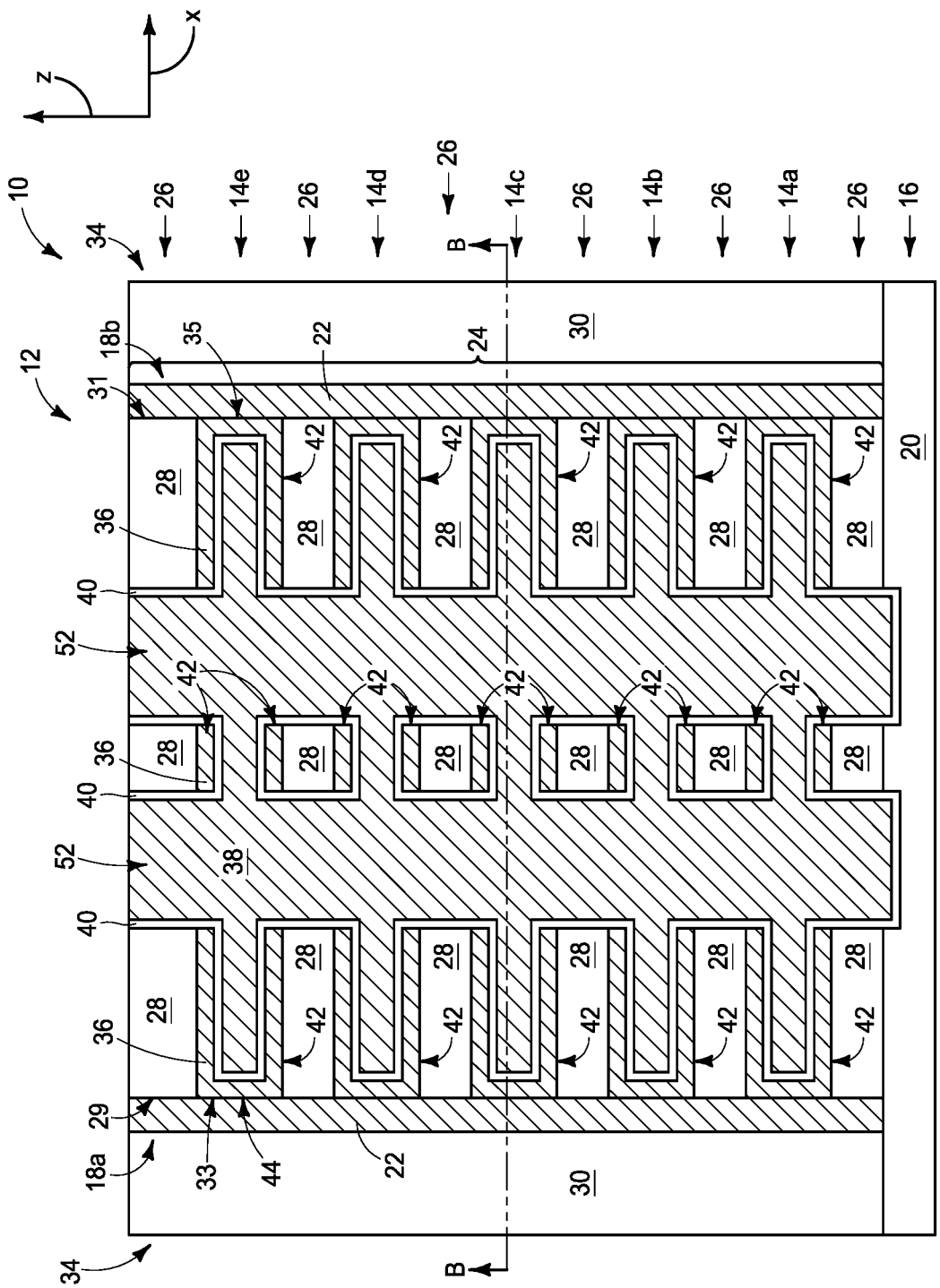
FIGS. 6A-6C are diagrammatic cross-sectional side views (FIGS. 6A and 6C) and a diagrammatic top-down sectional view (FIG. 6B) of an example region of an example capacitive unit. The views of FIGS. 6A and 6C are along the lines A-A and C-C of FIG. 6B, respectively, and the view of FIG. 6B is along the lines B-B of FIGS. 6A and 6C.
Figures 1, 6A:
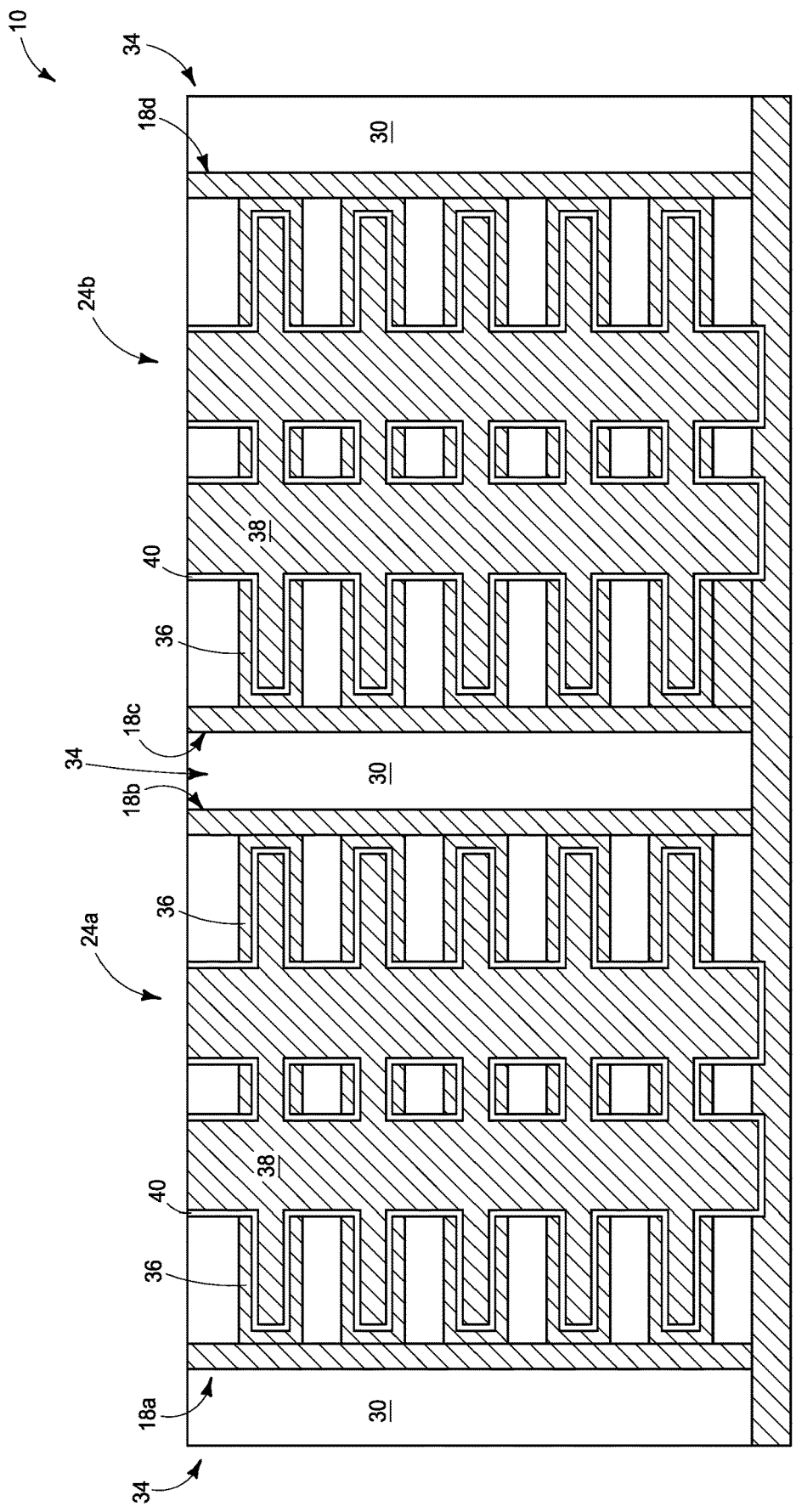
Figures 2, 6A:
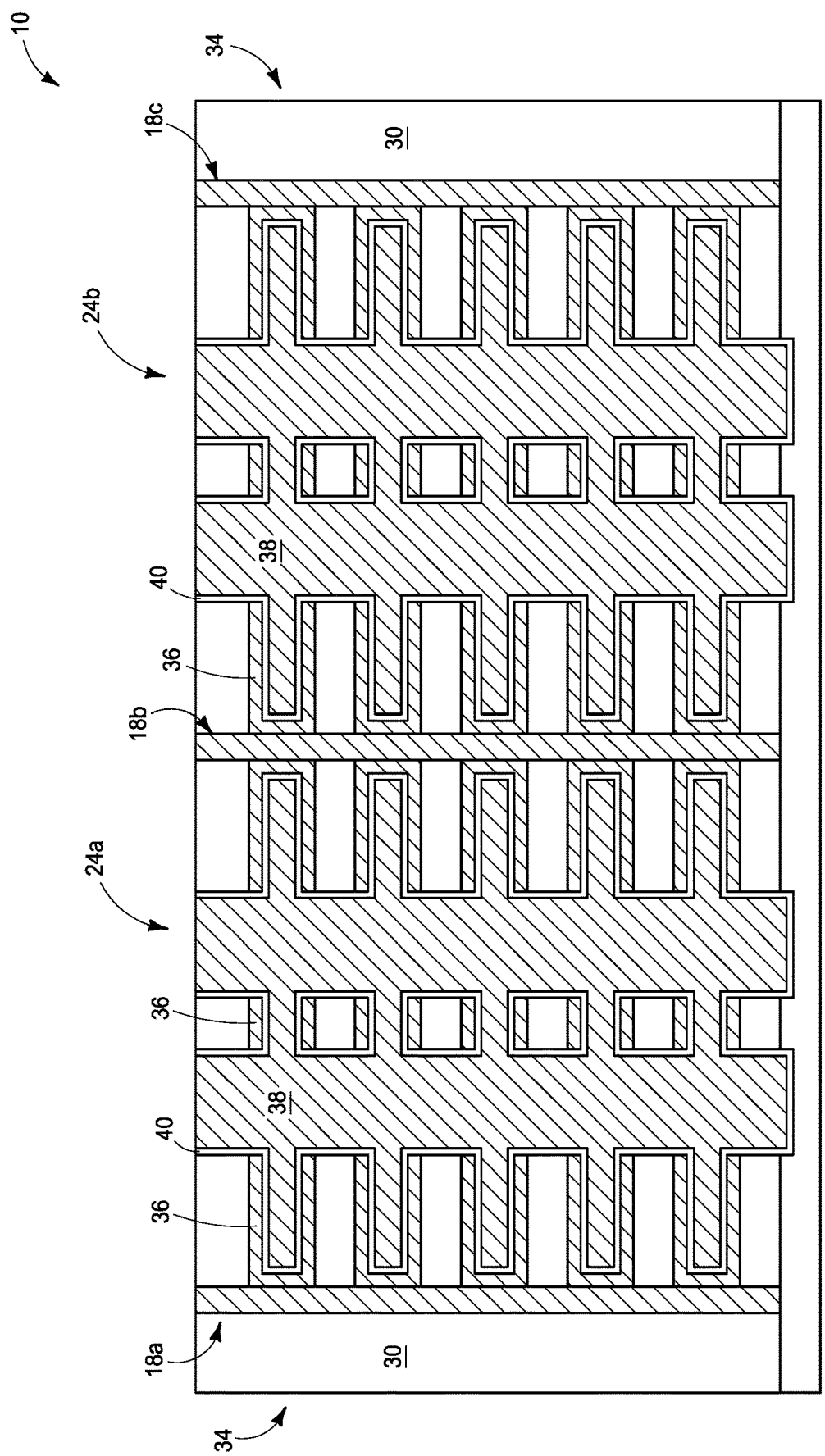
Figure 6B:
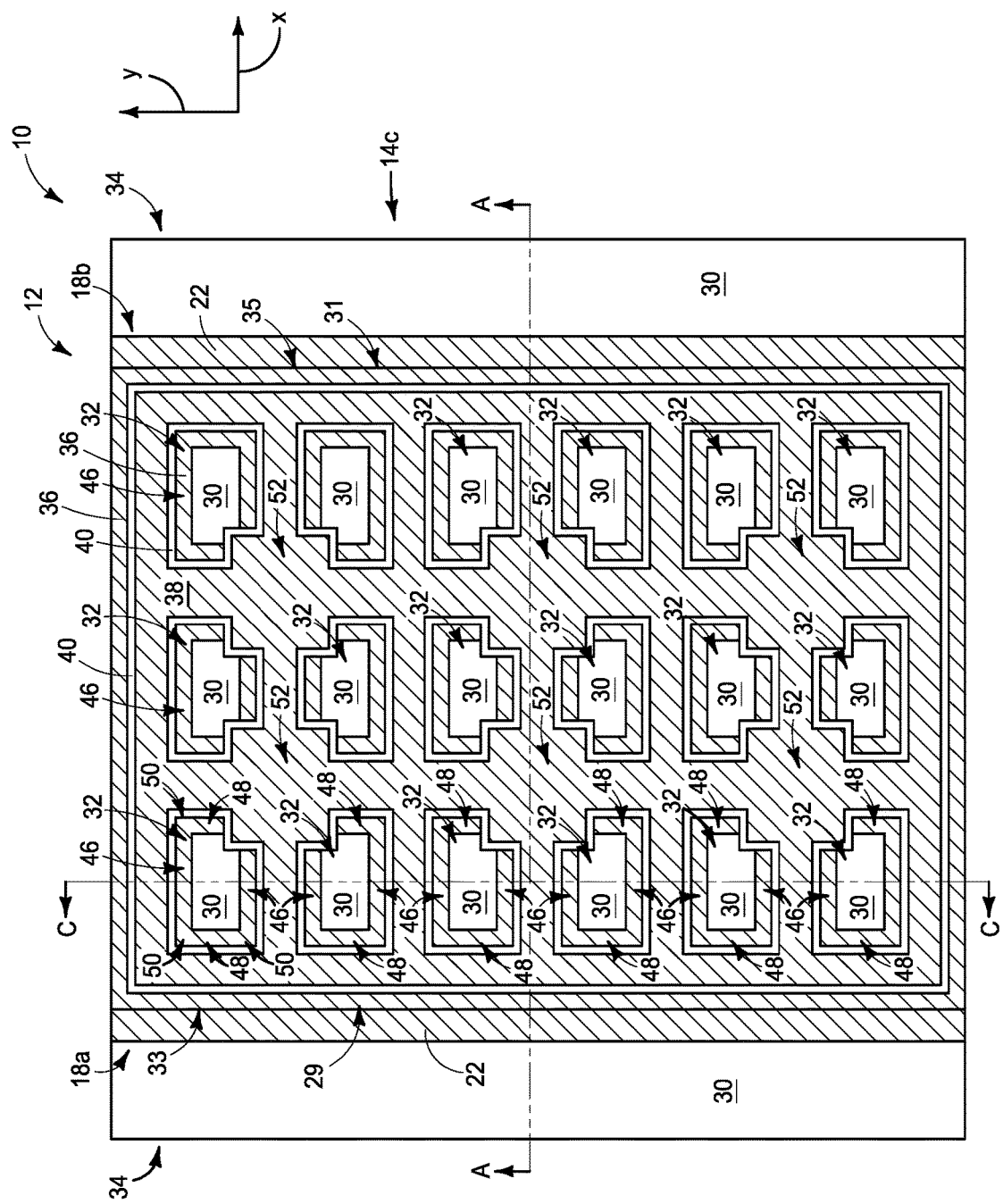
Figure 6C:
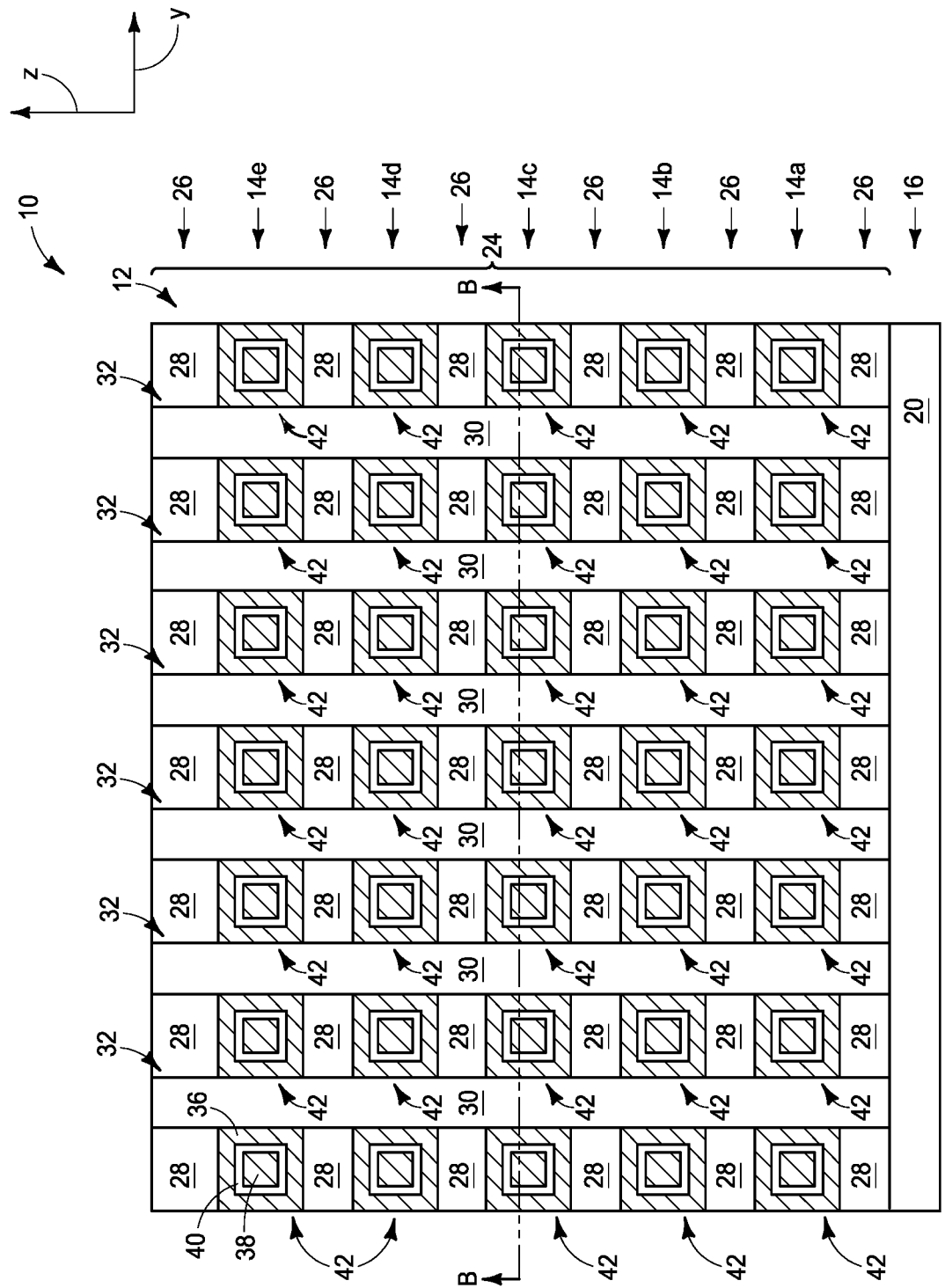

Referring to FIGS. 6A-6C, a region of an integrated assembly 10 is shown in cross-sectional side views (FIGS. 6A and 6C), and in top-down cross-sectional view (FIG. 6B). Axes are provided adjacent to the views of FIGS. 6A-6C to assist the reader in understanding the relative orientation of the drawings. Specifically, the top-down view of FIG. 6B is shown to be oriented relative to an X/Y axis system, the cross-sectional side view of FIG. 6A is shown to be oriented relative to an X/Z axis system, and the cross-sectional side view of FIG. 6B is shown to be oriented relative to a Y/Z axis system.

The integrated assembly includes a capacitive unit 12. The capacitive unit includes a series of vertically-stacked capacitive tiers (levels) 14a-e. In the illustrated embodiment, the capacitive unit 12 includes five of the vertically-stacked levels 14. In other embodiments, the capacitive unit may comprise a different number of the vertically-stacked levels. Generally, there will be at least two of the vertically-stacked capacitive levels 14. In some embodiments, it may be advantageous for there to be a large number of the vertically-stacked capacitive levels (tiers) in order to achieve a substantial amount of capacitance within the capacitive unit 12 while maintaining a small footprint of the capacitive unit. It can be desired to maintain a small footprint of the capacitive unit in order to conserve the valuable semiconductor real estate of an underlying semiconductor wafer (semiconductor substrate). In some embodiments, there may be at least eight of the capacitive tiers, at least 16 of the capacitive tiers, at least 32 of the capacitive tiers, at least 64 of the capacitive tiers, at least 128 of the capacitive tiers, at least 256 the capacitive tiers, at least 512 of the capacitive tiers, etc. In some embodiments, the capacitive unit 12 may be formed proximate to a memory array having vertically-stacked tiers of memory cells (e.g., one of the memory arrays described above in the Background section), and the number of capacitive tiers 14 may match the number of tiers of memory cells.

The integrated assembly 10 includes a bottom insulative region 16, and includes conductive plates 18a and 18b extending upwardly from the insulative region 16.

The insulative region 16 comprises an insulative material 20. The insulative material 20 may comprise any suitable insulative composition(s), and in some embodiments may comprise, consist essentially of, or consist of one or more of silicon dioxide, silicon nitride, aluminum oxide, zirconium oxide, etc.

The conductive plates 18a and 18b comprise conductive material 22. The conductive material 22 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 22 may be a metal-containing material, and may comprise, for example, one or more of tungsten, titanium, titanium nitride, tungsten nitride, etc.

In some embodiments, the capacitive tiers 14 may be considered to be arranged within a stack 24, with such stack comprising insulative levels 26 vertically between the capacitive tiers 14. The insulative levels 26 comprise insulative material 28. The insulative material 28 may comprise any suitable composition(s), and in some embodiments may comprise, consist essentially of, or consist of one or more of silicon dioxide, silicon nitride, aluminum oxide, etc. Although the insulative levels 26 are all shown comprising a homogeneous composition 28, in some embodiments one or more of the insulative levels may comprise two or more different insulative compositions which are vertically stacked one atop another. Further, although all of the insulative levels 26 are shown comprising the same composition 28 as one another, in other embodiments one or more of the insulative levels may comprise a different insulative composition than one or more others of the insulative levels.

The stack 24 may be considered to comprise first and second opposing sides 29 and 31 along the cross-sectional view of FIG. 6A. The plate 18a is along the first side 29, and the plate 18b is along the second side 31. Although the conductive plates 18a and 18b are shown to be along both of the opposing sides 29 and 31 of the stack 24, in other embodiments one of the conductive plates may be omitted so that a conductive plate is only along one of the sides 29 and 31. Alternatively, a conductive plate 18 may extend entirely around a lateral periphery of the stack, may extend along three of the four sides of the stack, etc.

Insulative material 30 is shown to be provided along the conductive plates 18a and 18b. The insulative material 30 may comprise any suitable composition(s), and in some embodiments may comprise, consist essentially of, or consist of one or more of silicon dioxide, silicon nitride, aluminum oxide, etc. The insulative material 30 along the conductive plates 18a and 18b may be considered to be configured as insulative panels 34. In some embodiments, the insulative panels may be referred to as insulative masses.

In some embodiments, the stack 24 may be considered to comprise a first vertical edge 33 along an outermost periphery of the first side 29, and to comprise a second vertical edge 35 along an outermost periphery of the second side 31. Each of the plates 18a and 18b may be considered to have one side along a vertical edge (33 or 35) of the stack 24, and to have an opposing side directly against one of the insulative panels 34.

Insulative pillars 32 extend through the stack 24 (the pillars 32 are visible in FIGS. 6B and 6C). The insulative pillars 32 are shown to comprise the insulative material 30. In other embodiments, the insulative pillars may comprise one or more other compositions.

The capacitive unit 12 includes first electrode material (bottom electrode material) 36, second electrode material (top electrode material) 38, and capacitor dielectric material 40 between the first and second electrode materials. In some embodiments, the electrode materials 36 and 38 may be considered to be spaced from one another by "at least the capacitor dielectric material 40" to indicate that there may be additional compositions, regions, etc., between the electrode materials 36 and 38 besides the illustrated capacitor dielectric material 40.

The electrode materials 36 and 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The electrode materials 36 and 38 may comprise a same composition as one another, or may comprise different compositions relative to one another. In some embodiments, the first electrode material 36 may comprise, consist essentially of, or consist of one or more metal nitrides (e.g., titanium nitride, tungsten nitride, etc.), and the second electrode material 38 may comprise, consist essentially of, or consist of one or more metals (e.g., tungsten, titanium, tantalum, etc.).

The capacitor dielectric material 40 (which may also be referred to as insulative capacitor material) may comprise any suitable composition(s). In some embodiments, the capacitor dielectric material 40 may comprise, consist essentially of, or consist of silicon dioxide. In some embodiments, the capacitor dielectric material 40 may comprise one or more high-k compositions (e.g., aluminum oxide, hafnium oxide, zirconium oxide, etc.), where the term high-k means a dielectric constant greater than that of silicon dioxide (greater than about 3.9).

The first electrode material 36 may be considered to be configured as tubes 42, with such tubes being clearly visible in the cross-sectional view of FIG. 6C. The capacitor dielectric material 40 may be considered to line the tubes 42, and the second electrode material 38 may be considered to extend into the lined tubes. The first electrode material 36 caps the tubes 42 along the sides 29 and 31 of the stack 24 (i.e., along vertical edges 33 and 35 of the stack 24), as shown in FIG. 6A. A capping region of the first electrode material 36 is diagrammatically illustrated with the label 44 along the cross-sectional view of FIG. 6A. Such capping region is along the vertical edge 33 of the side 29 of the stack 24. The capping region 44 of the first electrode material 36 is electrically coupled with the conductive plate 18a, and in the shown embodiment is directly against the conductive plate 18a.

The top-down view of FIG. 6B shows that that the first electrode material 36 (bottom electrode material) of the representative tier 14c is configured to include laterally-extending first segments 46 and longitudinally-extending second segments 48. Intersection regions (locations) 50 are shown where the first and second segments join to one another. The other tiers (14a, 14b, etc.) may be configured substantially identically to the illustrated tier 14c, where the term "substantially identical" means identical to within reasonable tolerances of fabrication and measurement.

Columns 52 of the second electrode material 38 extend vertically through the capacitive tiers 14, with such columns being shown in the top-down view of FIG. 6B and the cross-sectional side view of FIG. 6A. The electrode material 38 extends throughout the columns 52 and the tubes 42. In some embodiments, the electrode material 38 within the columns 52 may be considered to join with the electrode material 38 within the tubes 42.

Figure 1:
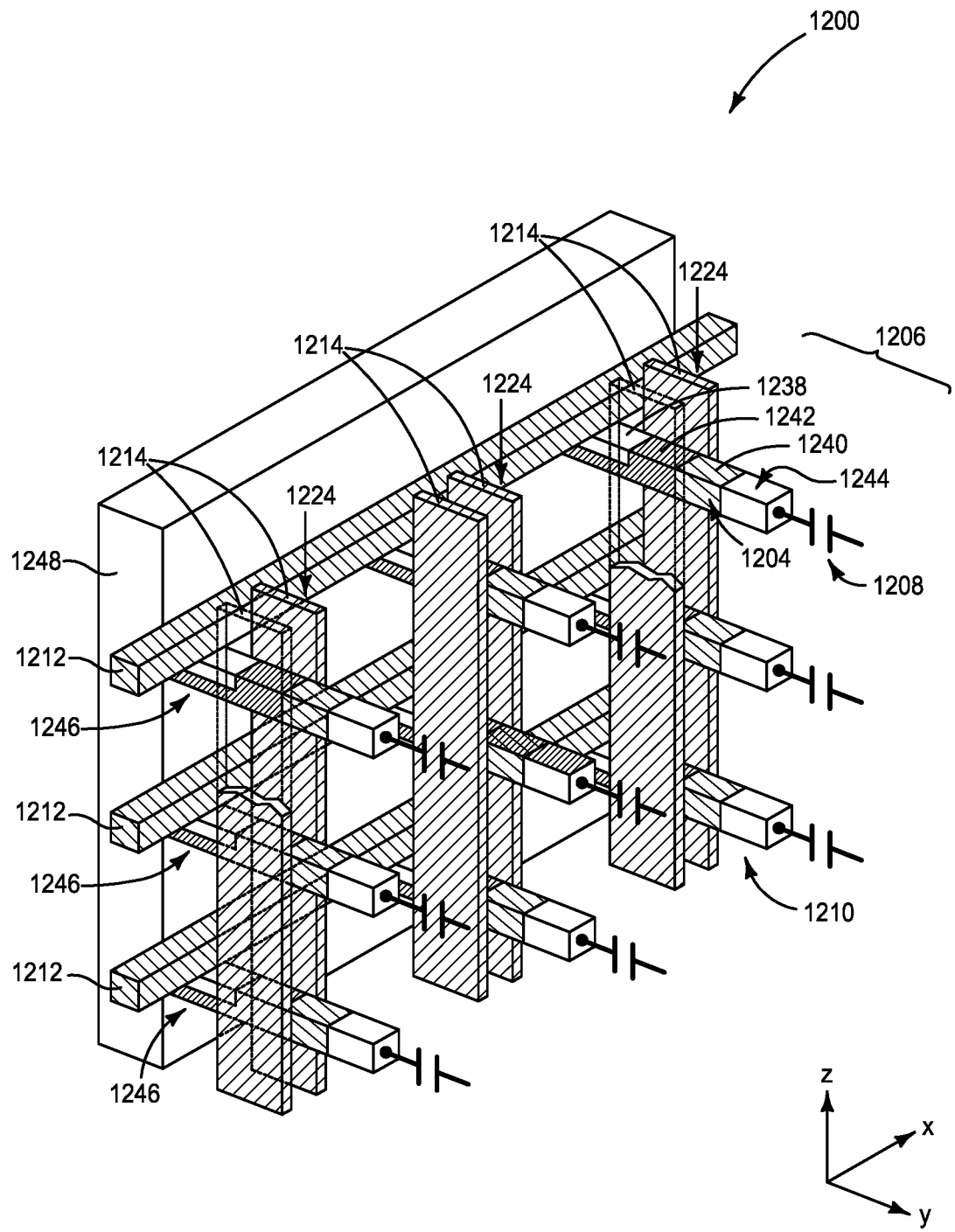
FIG. 1 is a diagrammatic three-dimensional view of a region of a prior art integrated assembly.
Figure 2:
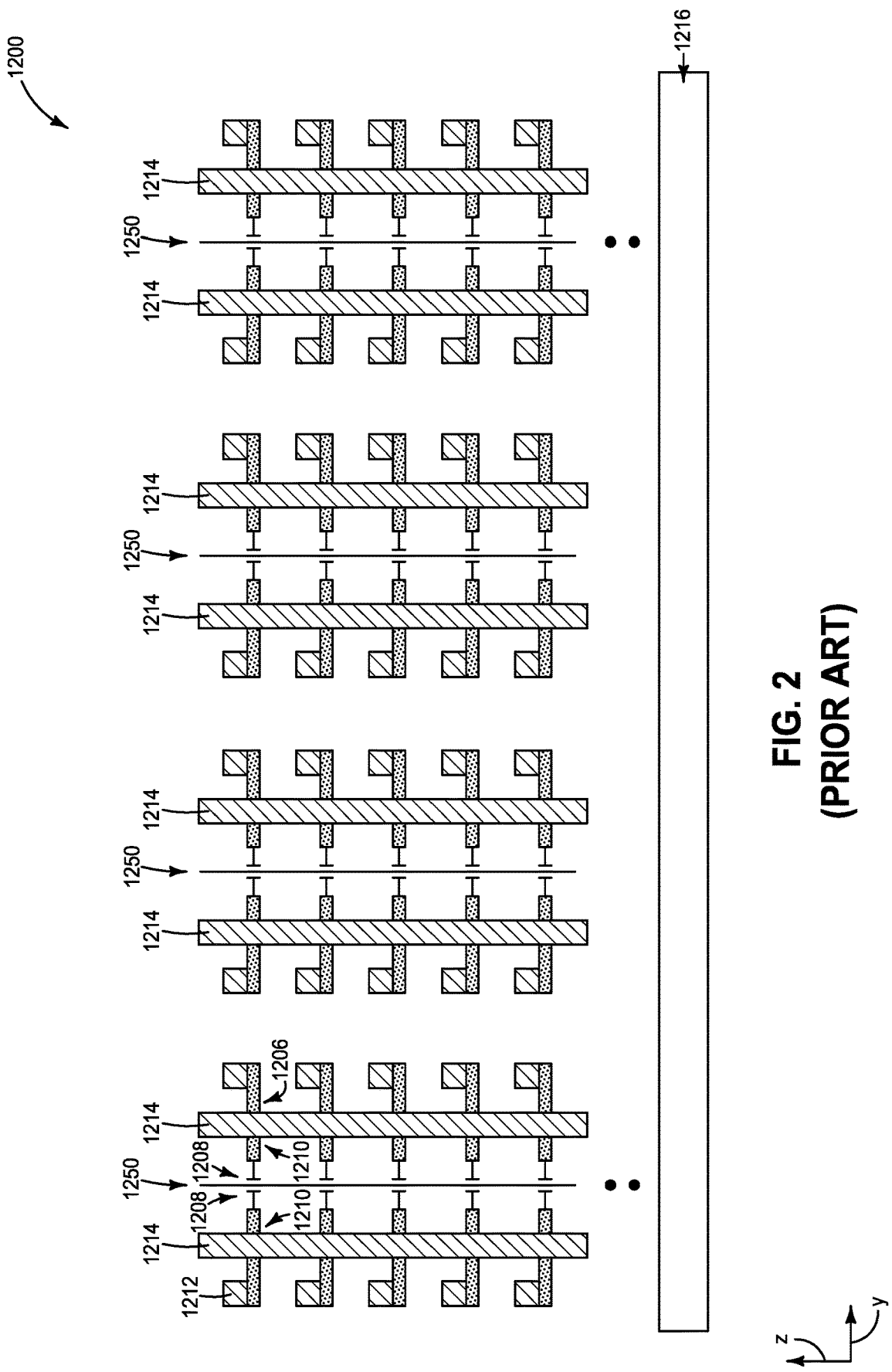
FIG. 2 is a diagrammatic cross-sectional side view of a region of a prior art assembly analogous to that of FIG. 1.
Figure 3:
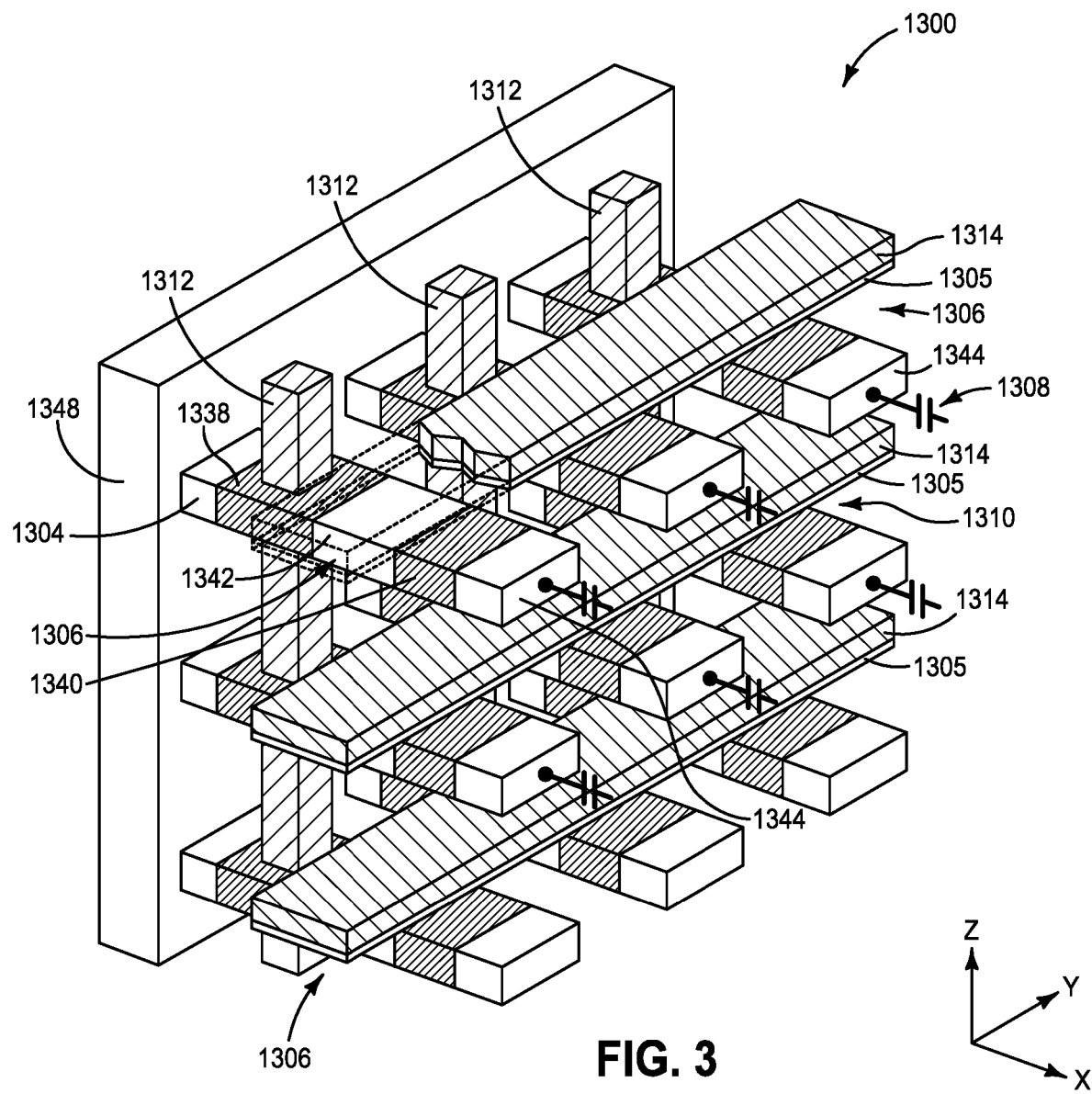
FIG. 3 is a diagrammatic three-dimensional view of a region of a prior art integrated assembly.
Figure 4:
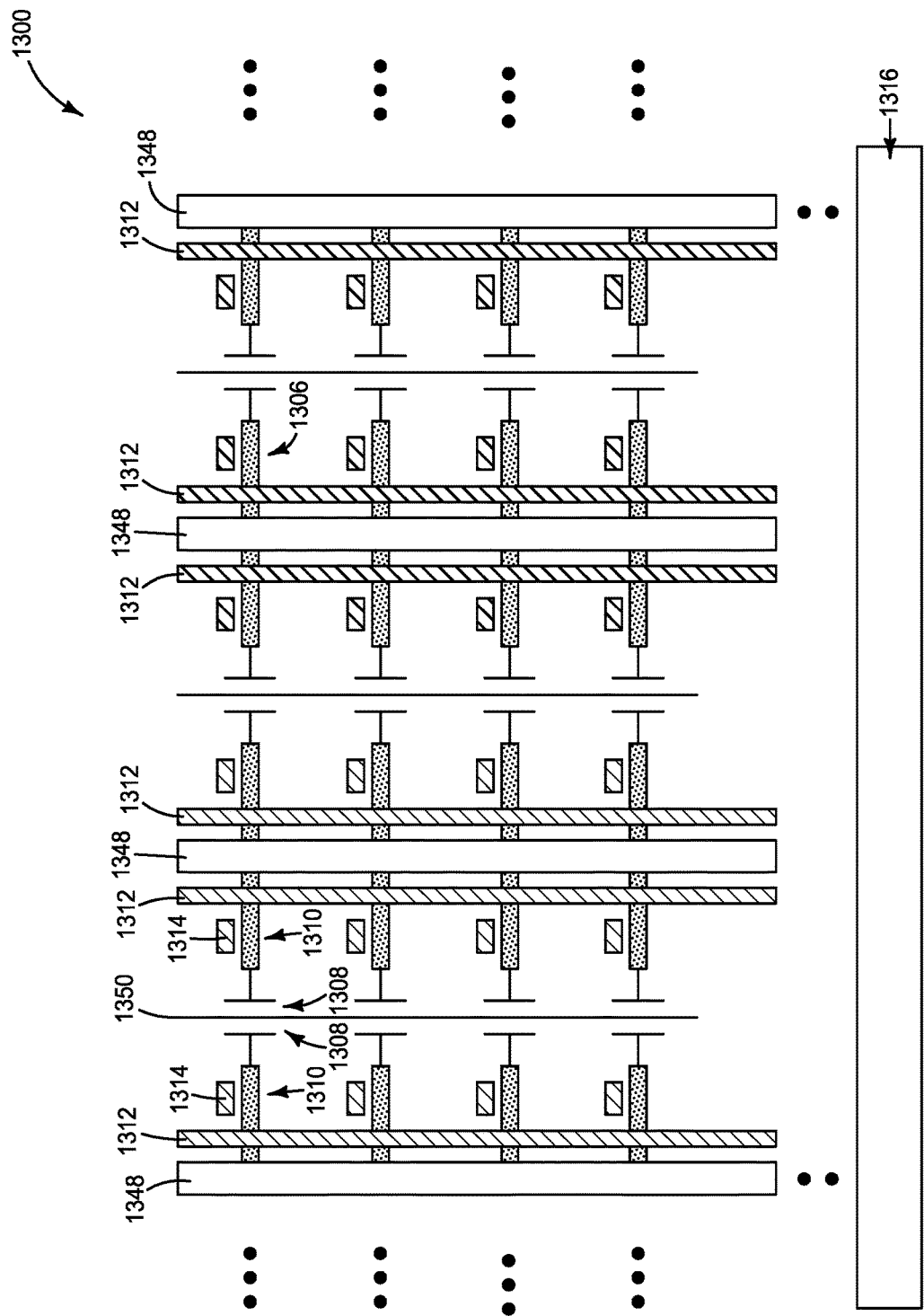
FIG. 4 is a diagrammatic cross-sectional side view of a region of a prior art assembly analogous to that of FIG. 3.

In some embodiments, the stack 24 of FIGS. 6A-6C may be one of two or more substantially identical stacks. The stacks may be incorporated into the same capacitive unit as one another, or may be incorporated into different capacitive units relative to one another. FIGS. 6A-1 and 6A-2 show example embodiments in which two or more substantially-identical stacks 24 are formed adjacent to one another. The illustrated stacks of FIGS. 6A-1 and 6A-2 are labeled as 24a and 24b so that they may be distinguished from one another.

FIG. 6A-1 shows an embodiment in which the stack 24a is formed between a pair of conductive plates 18a and 18b. The conductive plate 18b has one side directly adjacent to the first electrode material 36 within the stack 24a, and has another side adjacent to an insulative panel 34, with such insulative panel being between the stacks 24a and 24b. In contrast, FIG. 6A-2 shows an embodiment in which the conductive plate 18b has one side directly adjacent to the first electrode material 36 within the stack 24a, and has another side directly adjacent to the first electrode material 36 within the second stack 24b.

The capacitive units 12 described above may be formed with any suitable processing. Example processing is described with reference to FIGS. 7-13.

Figure 7A:
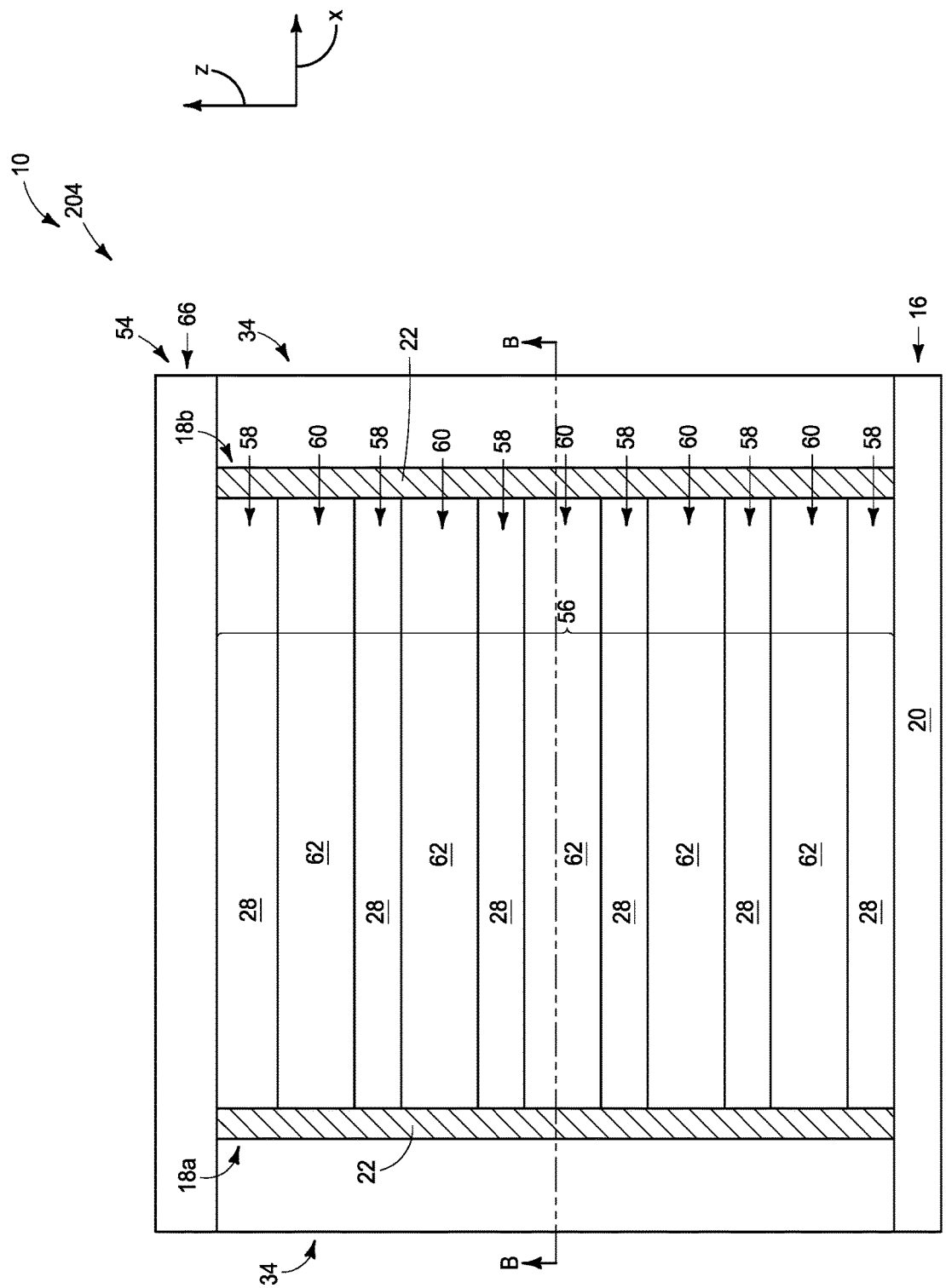
FIGS. 7A and 7B are a diagrammatic cross-sectional side view (FIG. 7A) and a diagrammatic top-down sectional view (FIG. 7B) of an example region of an example integrated assembly at an example process stage of an example method. The view of FIG. 7A is along the line A-A of FIG. 7B, and the view of FIG. 7B is along the line B-B of FIG. 7A.
Figure 7B:
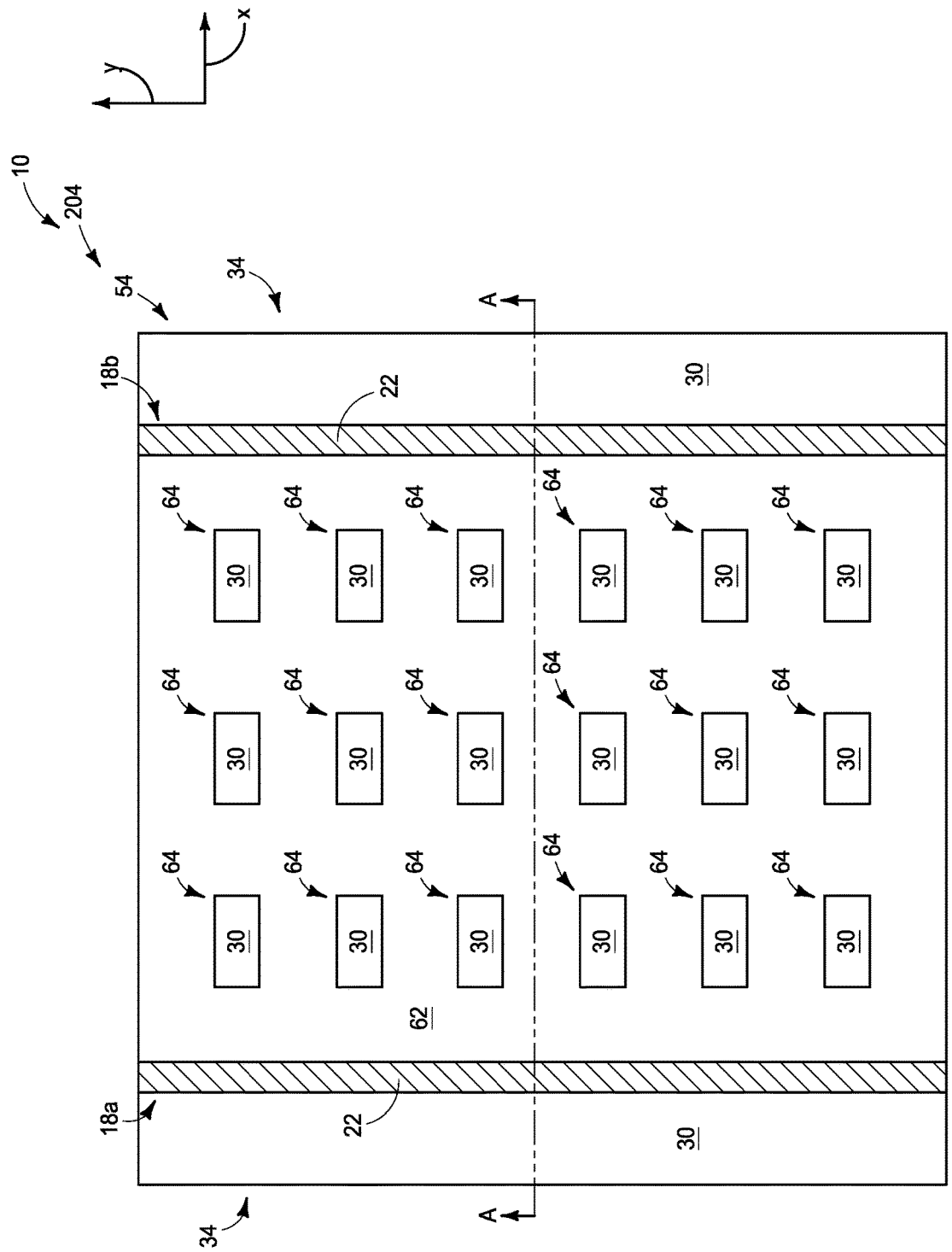

FIGS. 7A and 7B show a side view and a top-down view, respectively, of a region of the integrated assembly 10 at a process stage that may be utilized during fabrication of the assembly of FIGS. 6A-6C. The view of FIG. 7A is analogous to that of FIG. 6A, and the view of FIG. 7B is analogous to that of FIG. 6B. The process stage of FIGS. 7A and 7B has a construction 54 formed to include a stack 56 between the conductive plates 18a and 18b. The illustrated region of the integrated assembly 10 of FIGS. 7A and 7B may be referred to as a capacitive unit region 204 analogous to the region described above with reference to FIG. 5.

The stack 56 comprises alternating first and second levels (tiers) 58 and 60. The first levels 58 comprise the insulative material 28, and the second levels 60 comprise sacrificial material 62. In some embodiments, the sacrificial material 62 may comprise silicon. The silicon may be in any suitable crystalline form (e.g., amorphous, polycrystalline, etc.). The stack 56 may comprise any suitable number of the alternating levels 58 and 60. Eventually, the levels 60 become the tiers 14 described above with reference to FIGS. 6A-6C. Accordingly, in some embodiments the stack 56 may comprise eight of the levels 60, 16 of the levels 60, 32 of the levels 60, 64 of the levels 60, 128 of the levels 60, 256 of the levels 60, 512 of the levels 60, etc.

Insulative pillars 64 extend through the stack 56, with such pillars being visible in the top-down view of FIG. 7B. The pillars are shown to comprise the composition 30.

The plates 18a and 18b are shown be formed along both sides of the stack 56.

A hard mask 66 is shown to be formed over the stack 56. The hard mask may comprise any suitable composition(s), and in some embodiments may comprise one or more of carbon, silicon dioxide, silicon nitride, silicon oxynitride, bottom anti-reflective coating (BARC), etc.

Figure 8A:
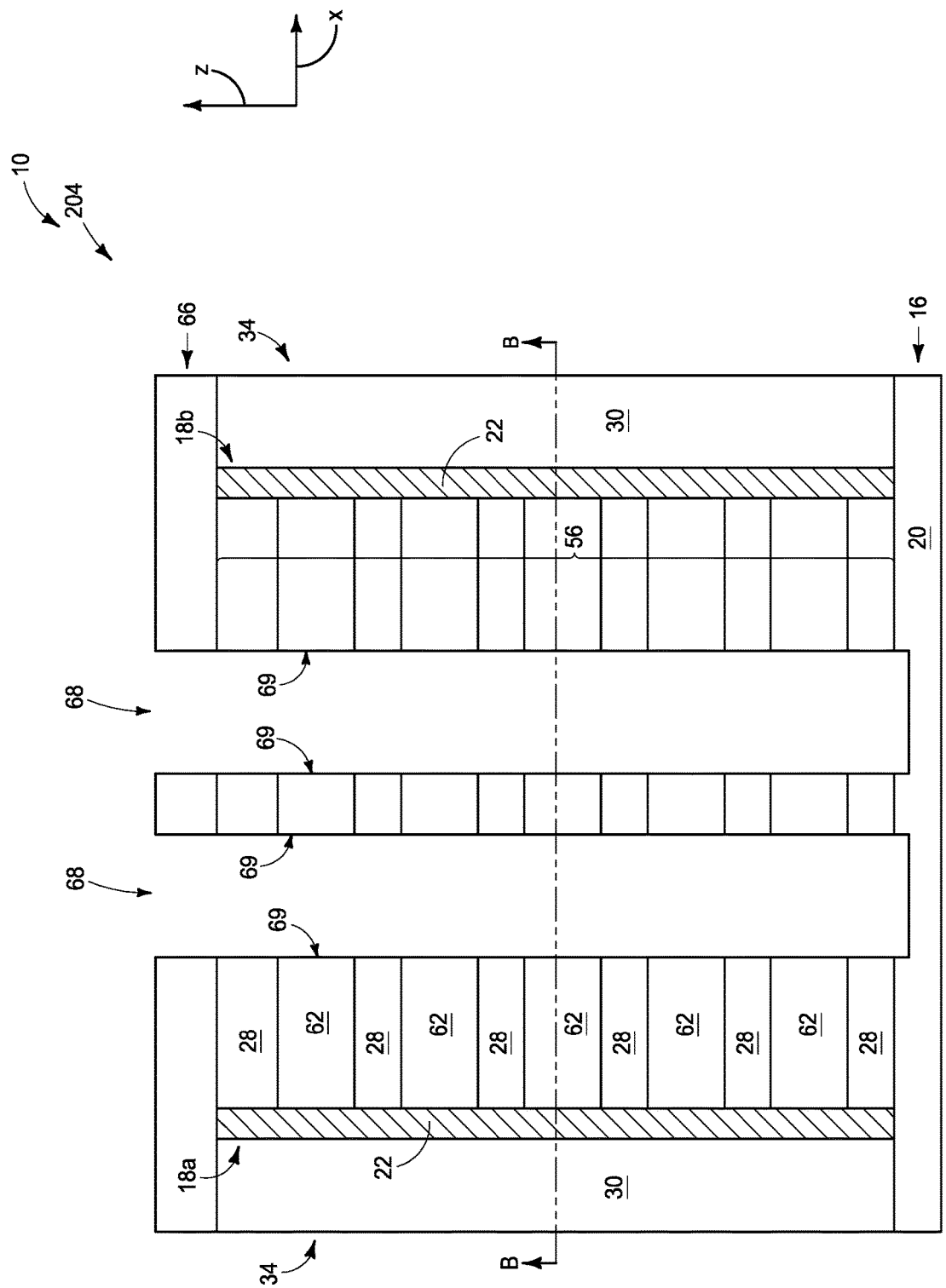
FIGS. 8A and 8B are a diagrammatic cross-sectional side view (FIG. 8A) and a diagrammatic top-down sectional view (FIG. 8B) of the example region of the example integrated assembly of FIGS. 7A and 7B at an example process stage subsequent to that of FIGS. 7A and 7B. The view of FIG. 8A is along the line A-A of FIG. 8B, and the view of FIG. 8B is along the line B-B of FIG. 8A.
Figure 8B:
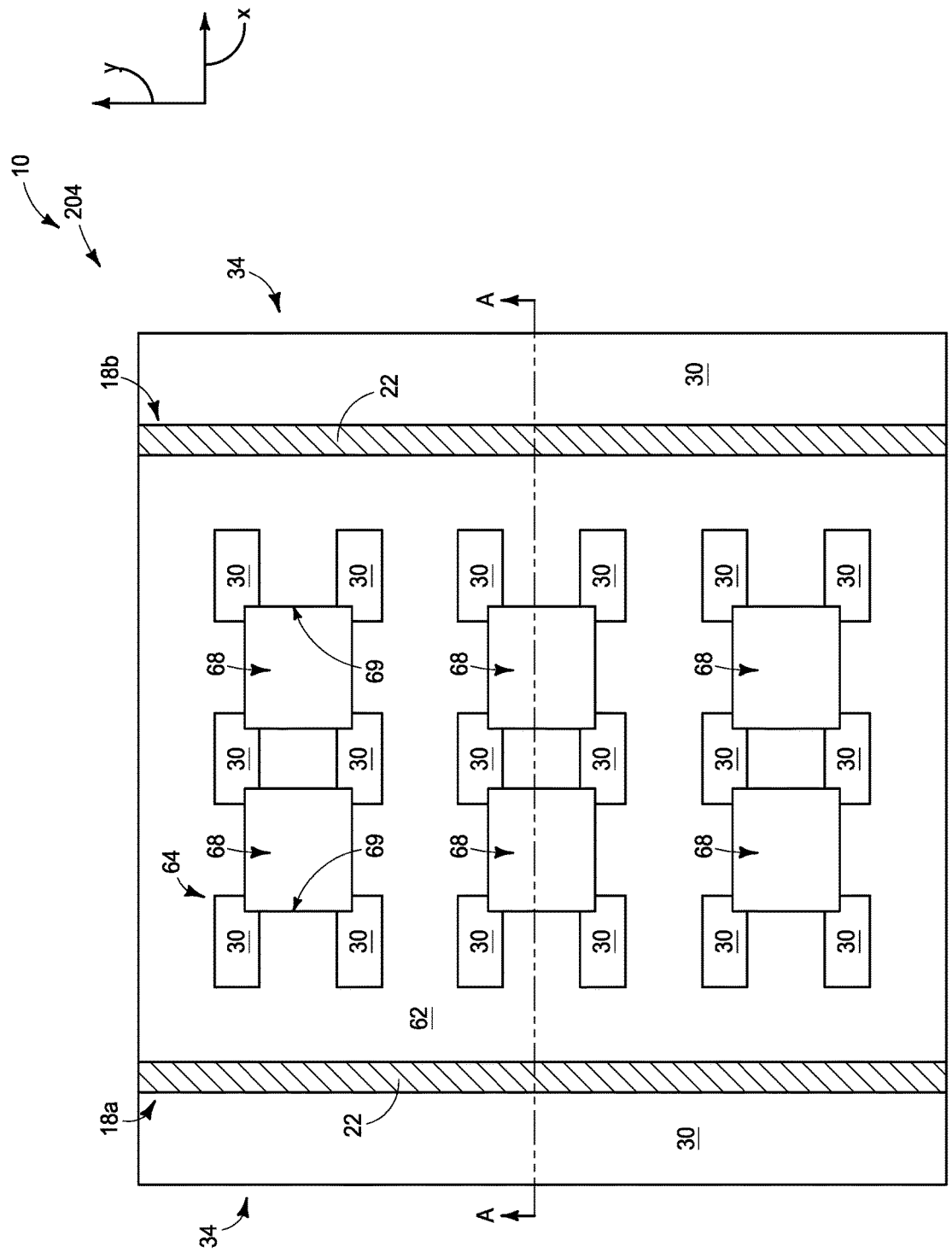

Referring to FIGS. 8A and 8B, the hard mask 66 is patterned to form openings 68, and such openings are then extended through the stack 56 with one or more suitable etches. In the illustrated embodiment, the openings penetrate partially into the insulating material 20 of the bottom insulative region 16. In other embodiments, the openings 68 may stop at an upper surface of the material 20.

The openings 68 have sidewalls 69, and the sacrificial material 62 is exposed along such sidewalls.

Figure 9A:
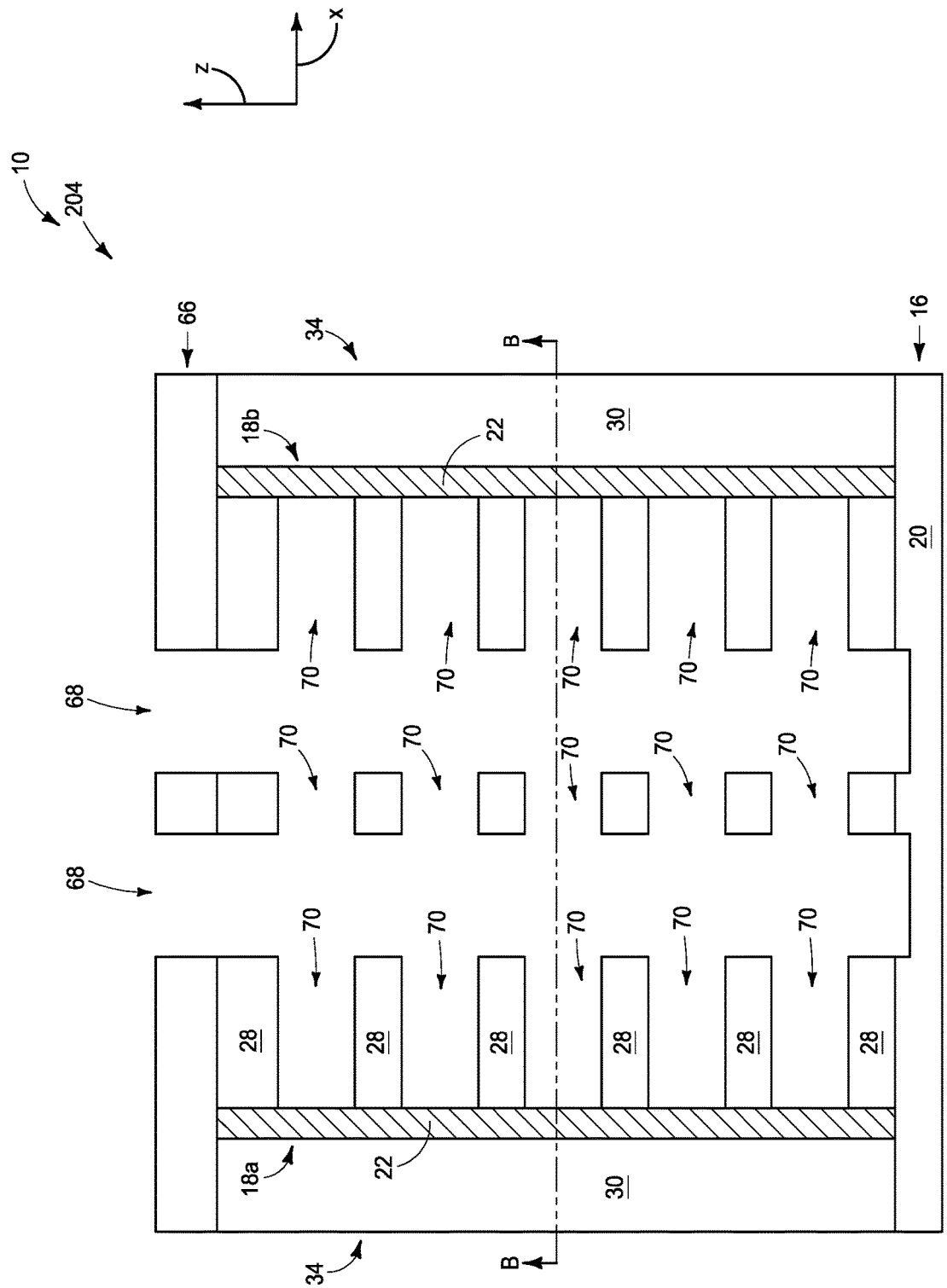
FIGS. 9A and 9B are a diagrammatic cross-sectional side view (FIG. 9A) and a diagrammatic top-down sectional view (FIG. 9B) of the example region of the example integrated assembly of FIGS. 7A and 7B at an example process stage subsequent to that of FIGS. 8A and 8B. The view of FIG. 9A is along the line A-A of FIG. 9B, and the view of FIG. 9B is along the line B-B of FIG. 9A.
Figures 1, 9A:
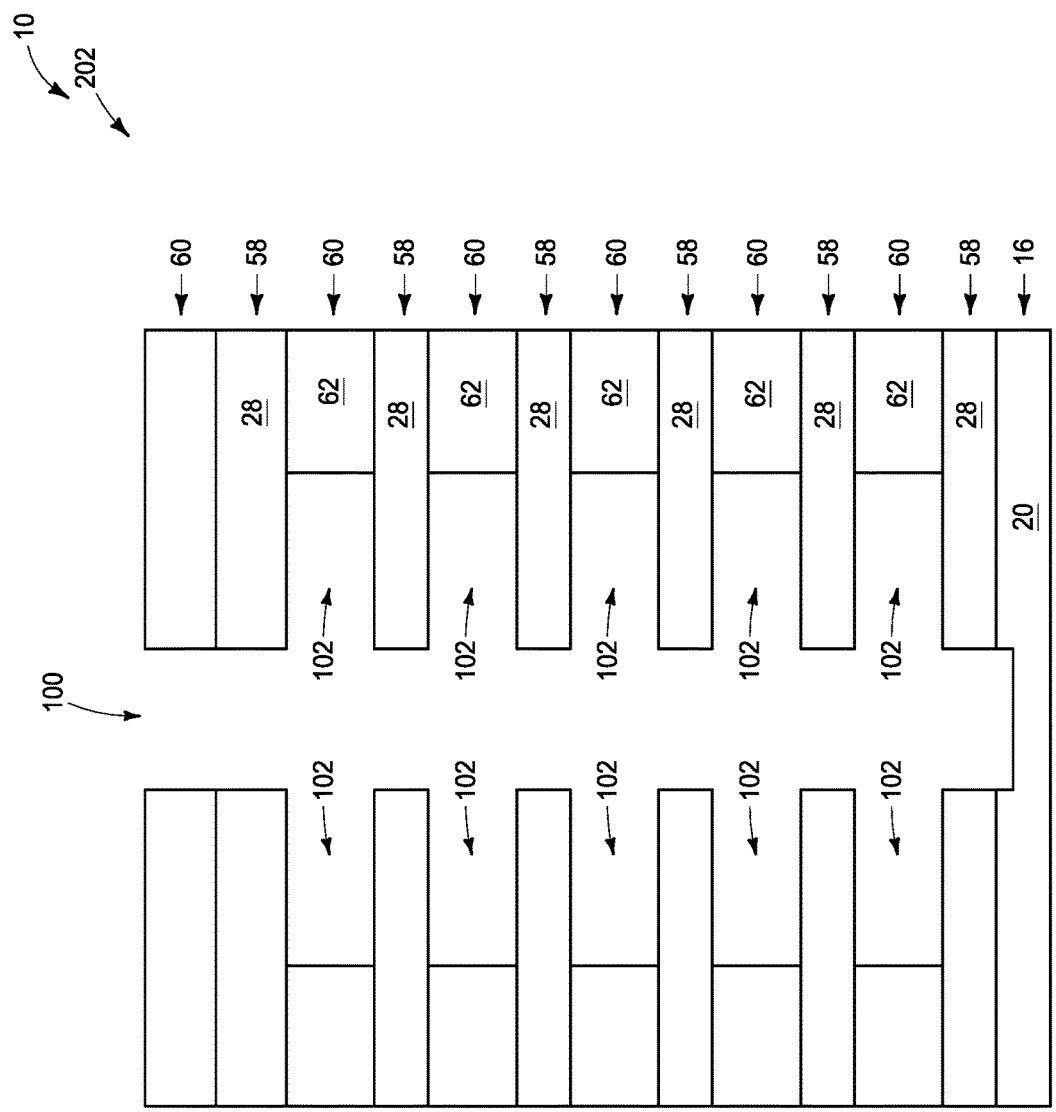
Figure 9B:
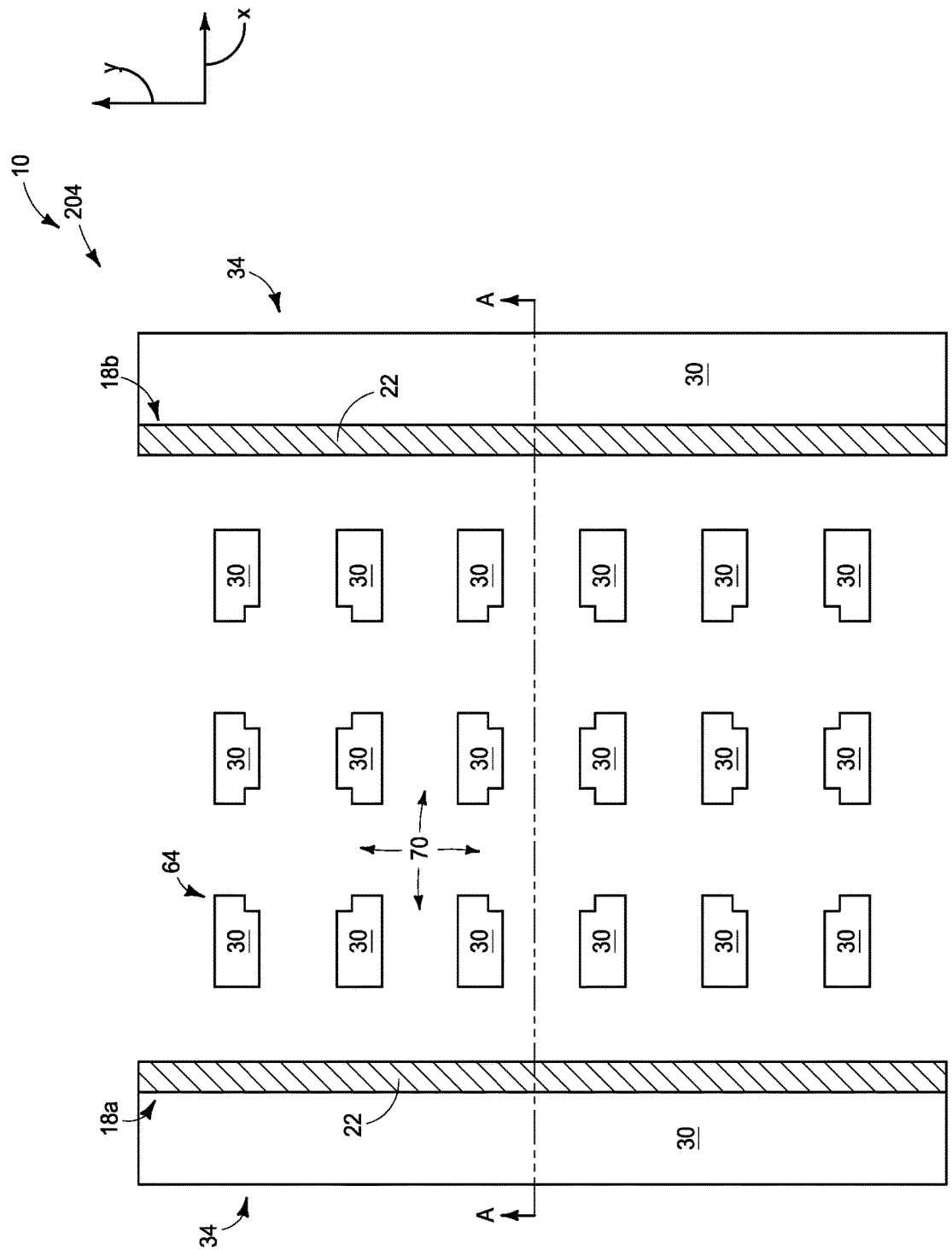

Referring to FIGS. 9A and 9B, the sacrificial material 62 (FIGS. 8A and 8B) is removed to form conduits 70, with such conduits being along the second levels 60 (the second levels 60 are identified in FIG. 7A). The conduits 70 extend around the insulative pillars 64 (as shown in FIG. 9B), and extend to conductive surfaces of the conductive plates 18a and 18b. In the illustrated embodiment, the entirety of the sacrificial material 62 is removed relative to the structures of FIGS. 9A and 9B to form the conduits 70. In other embodiments, only some of such sacrificial material may be removed.

FIG. 9A-1 shows that the integrated assembly 10 may also include a memory region 202 analogous to the region described above with reference to FIG. 5. The memory region 202 may be proximate to the capacitive unit region 204 of FIGS. 9A and 9B. The region 202 of FIG. 9A-1 is shown at the same process stage as the capacitive unit region 204 of FIGS. 9A and 9B. The memory region 202 includes the insulative levels, and includes the levels 60 comprising the material 62. The material 62 may be channel material analogous to the materials within the channel regions 1242 and 1342 of FIGS. 1-4. The memory region 202 may comprise vertically extending digit lines or wordlines of the types described in FIGS. 1-4 (not shown in FIG. 9A-1). Laterally-extending capacitors are eventually going to be formed along the levels 60, and such capacitors may be formed simultaneously with capacitive tiers which are formed within the capacitive unit region 204.

An opening 100 is formed to extend through the levels 58 and 60 of the stack 202, and such opening may be formed simultaneously with the openings 68 of FIGS. 8A and 8B. The material 62 is recessed from sidewalls of the opening 102 to form conduits 102.

Figure 10A:
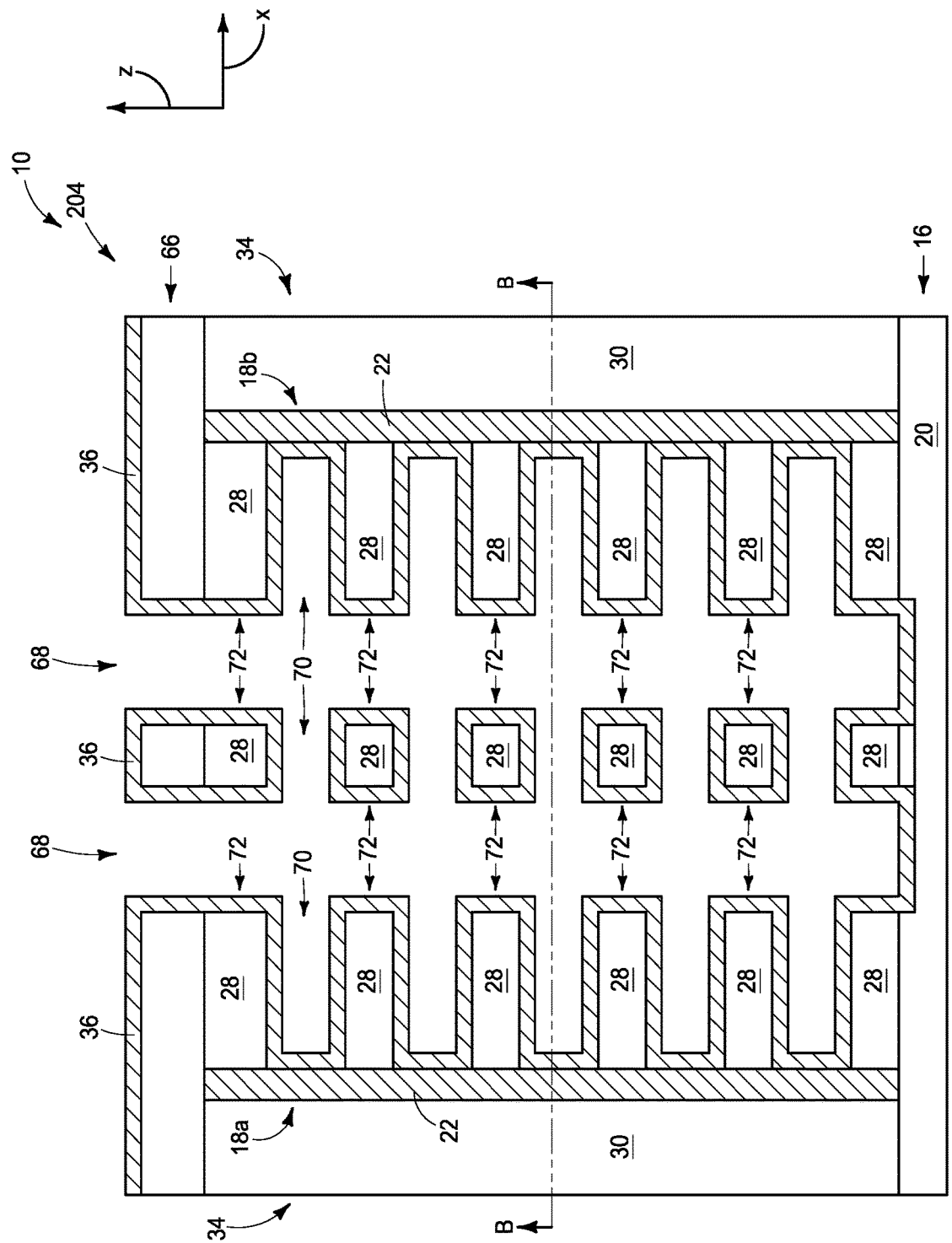
FIGS. 10A and 10B are a diagrammatic cross-sectional side view (FIG. 10A) and a diagrammatic top-down sectional view (FIG. 10B) of the example region of the example integrated assembly of FIGS. 7A and 7B at an example process stage subsequent to that of FIGS. 9A and 9B. The view of FIG. 10A is along the line A-A of FIG. 10B, and the view of FIG. 10B is along the line B-B of FIG. 10A.
Figures 1, 10A:
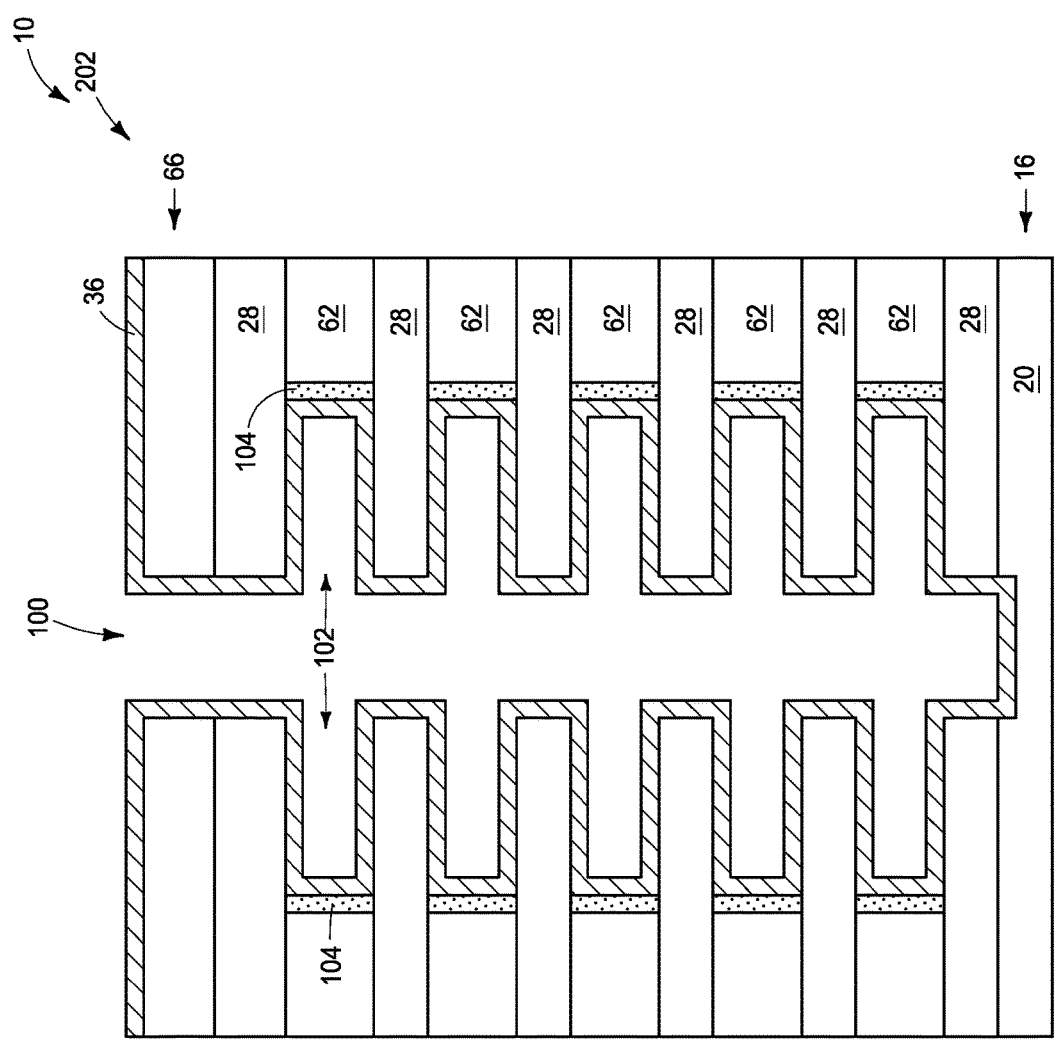
Figure 10B:
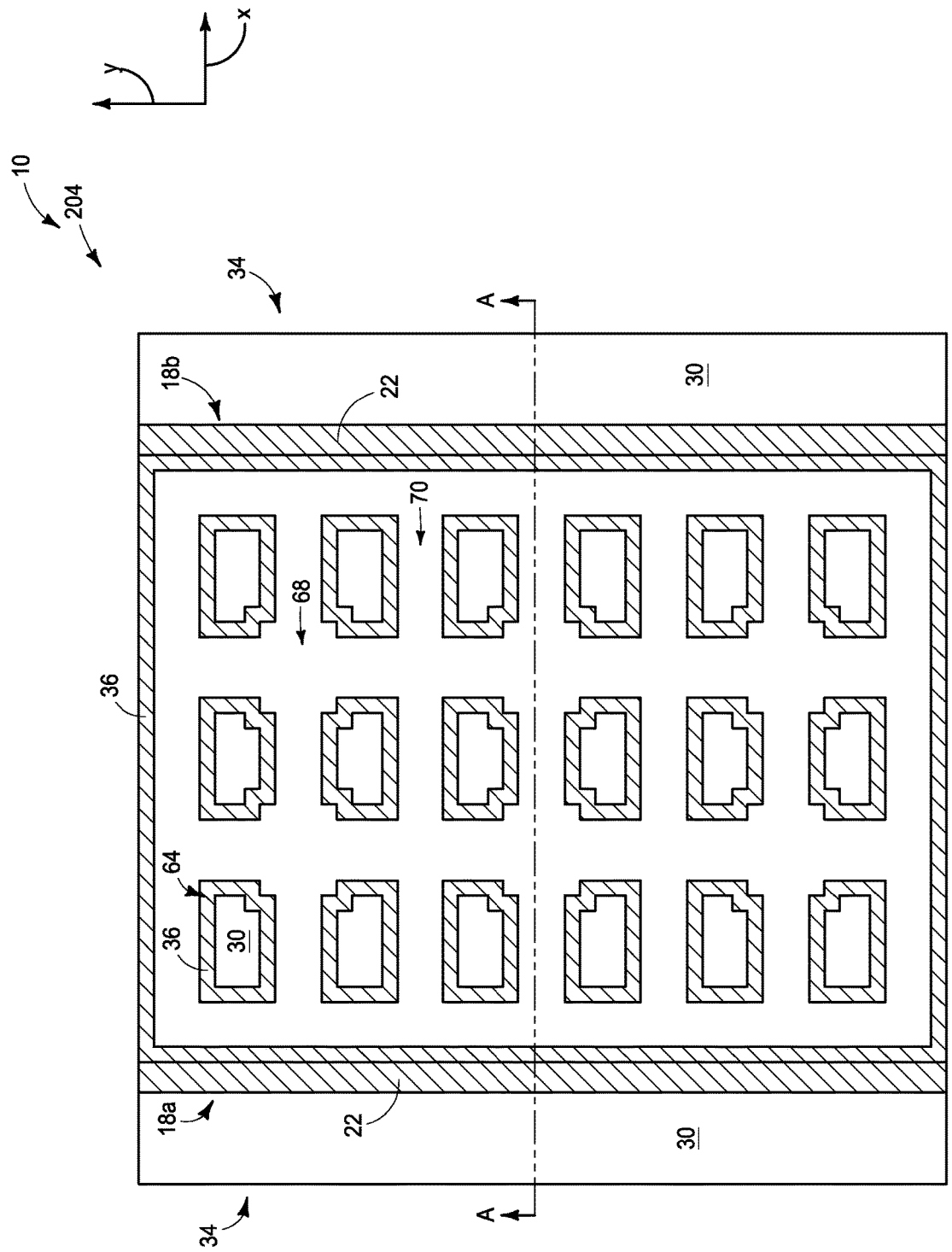

Referring to FIGS. 10A and 10B, the first electrode material 36 is formed within the conduits 70 to line the conduits. Portions of the first electrode material 70 directly contact the conductive plates 18a and 18b, and accordingly the first electrode material 36 is electrically coupled with the conductive plates.

The first electrode material 36 lines sidewalls of the openings 68, in addition to lining the conduits 70. Specifically, segments 72 of the first electrode material are along the sidewalls of the openings 68, with such segments extending along edges of the insulative material 28 of the first levels 58 (the first levels 58 are identified in FIG. 7A).

FIG. 10A-1 shows that exposed regions of the semiconductor material 62 within the conduits 102 are doped to form source/drain regions 104. Stippling is provided within the source/drain regions to assist the reader in visualizing such regions. The source/drain regions 104 may be analogous to the regions 1240 and 1340 described above with reference to FIGS. 1-4.

The first electrode material 36 is formed within the conduits 102, and is formed to be electrically coupled with the source/drain regions 104. The first electrode material 36 lines the conduits 102.

Figure 11A:
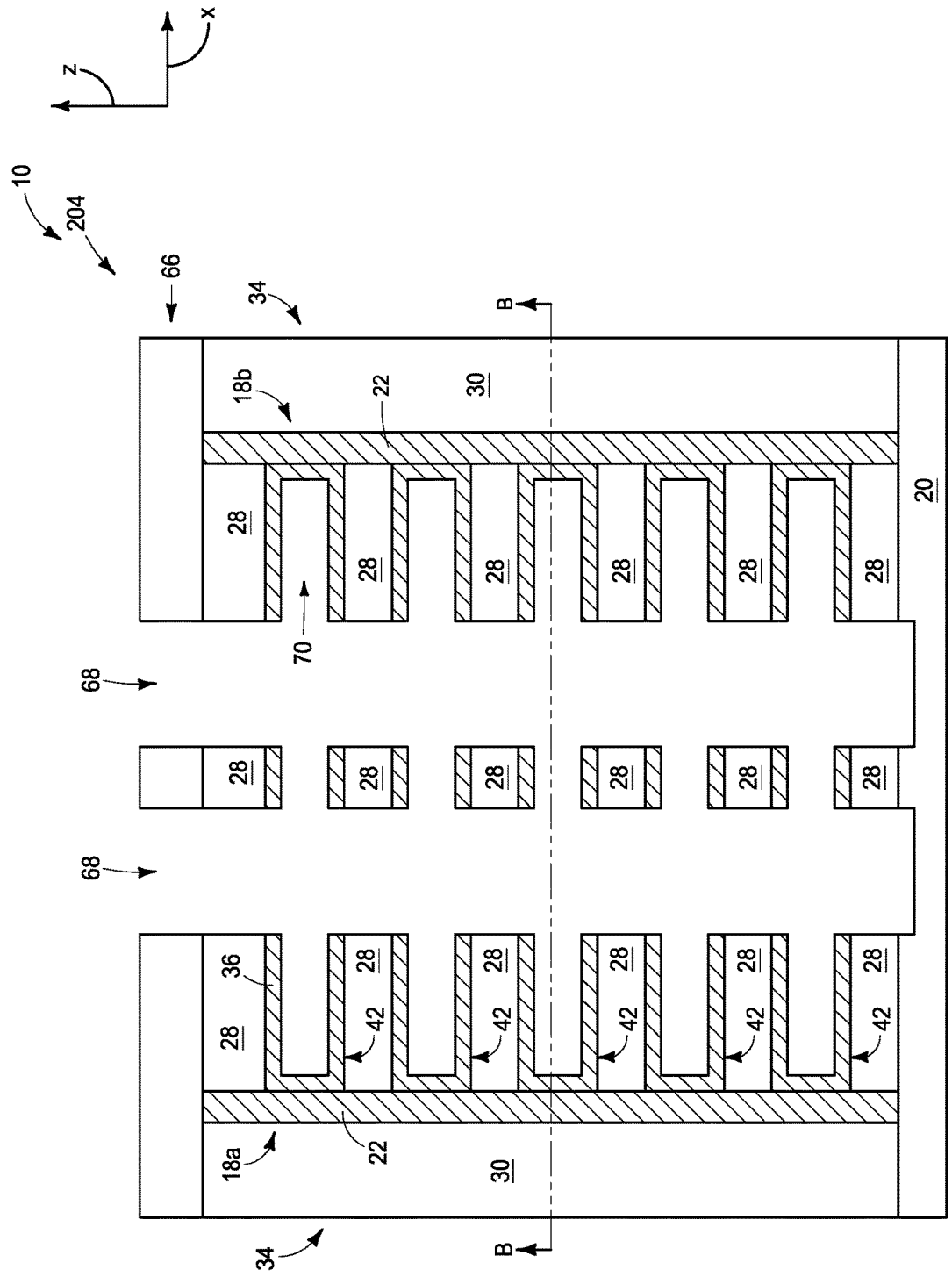
FIGS. 11A and 11B are a diagrammatic cross-sectional side view (FIG. 11A) and a diagrammatic top-down sectional view (FIG. 11B) of the example region of the example integrated assembly of FIGS. 7A and 7B at an example process stage subsequent to that of FIGS. 10A and 10B. The view of FIG. 11A is along the line A-A of FIG. 11B, and the view of FIG. 11B is along the line B-B of FIG. 11A.
Figures 1, 11A:
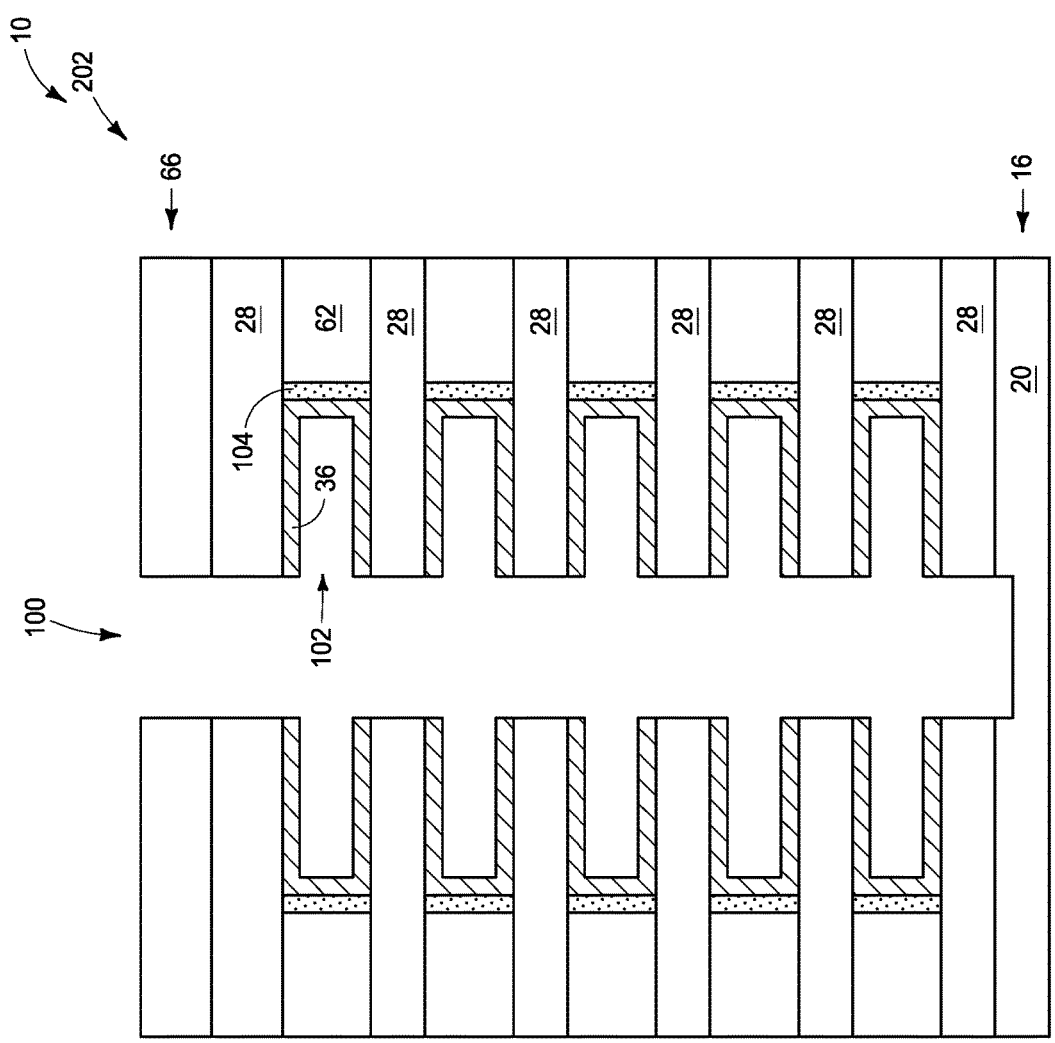
Figure 11B:
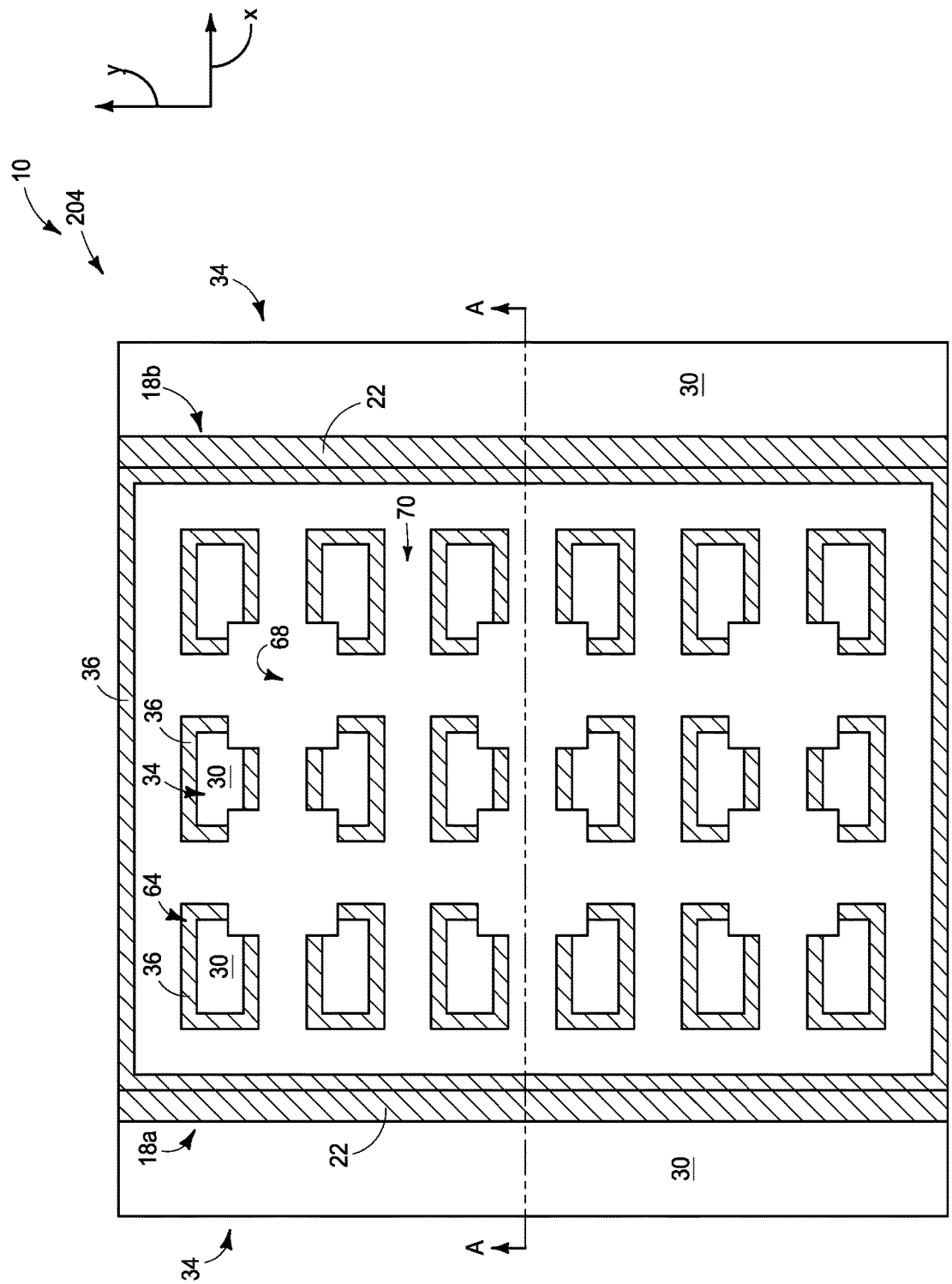

Referring to FIGS. 11A and 11B, additional etching is utilized to remove the segments 72 (FIG. 10A) of the first electrode material 36, and to thereby reestablish the sidewalls of the openings 68.

FIG. 11A-1 shows that the etching utilized in the capacitive unit region 204 of FIGS. 11A and 11B may be conducted relative to the memory region 202 to remove excess of the first electrode material 36 and reestablish sidewalls of the opening 100.

Figure 12A:
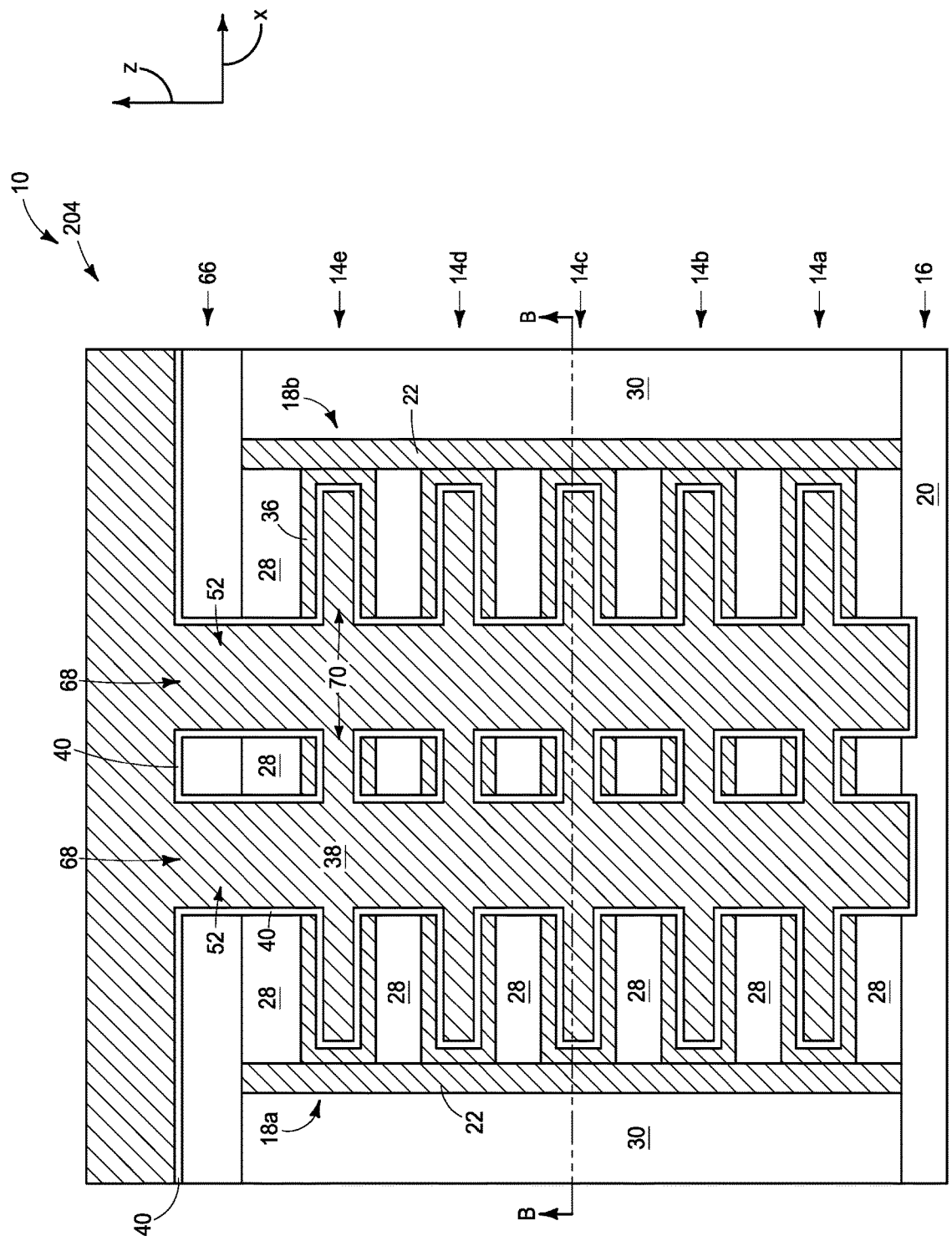
FIGS. 12A and 12B are a diagrammatic cross-sectional side view (FIG. 12A) and a diagrammatic top-down sectional view (FIG. 12B) of the example region of the example integrated assembly of FIGS. 7A and 7B at an example process stage subsequent to that of FIGS. 11A and 11B. The view of FIG. 12A is along the line A-A of FIG. 12B, and the view of FIG. 12B is along the line B-B of FIG. 12A.
Figures 1, 12A:
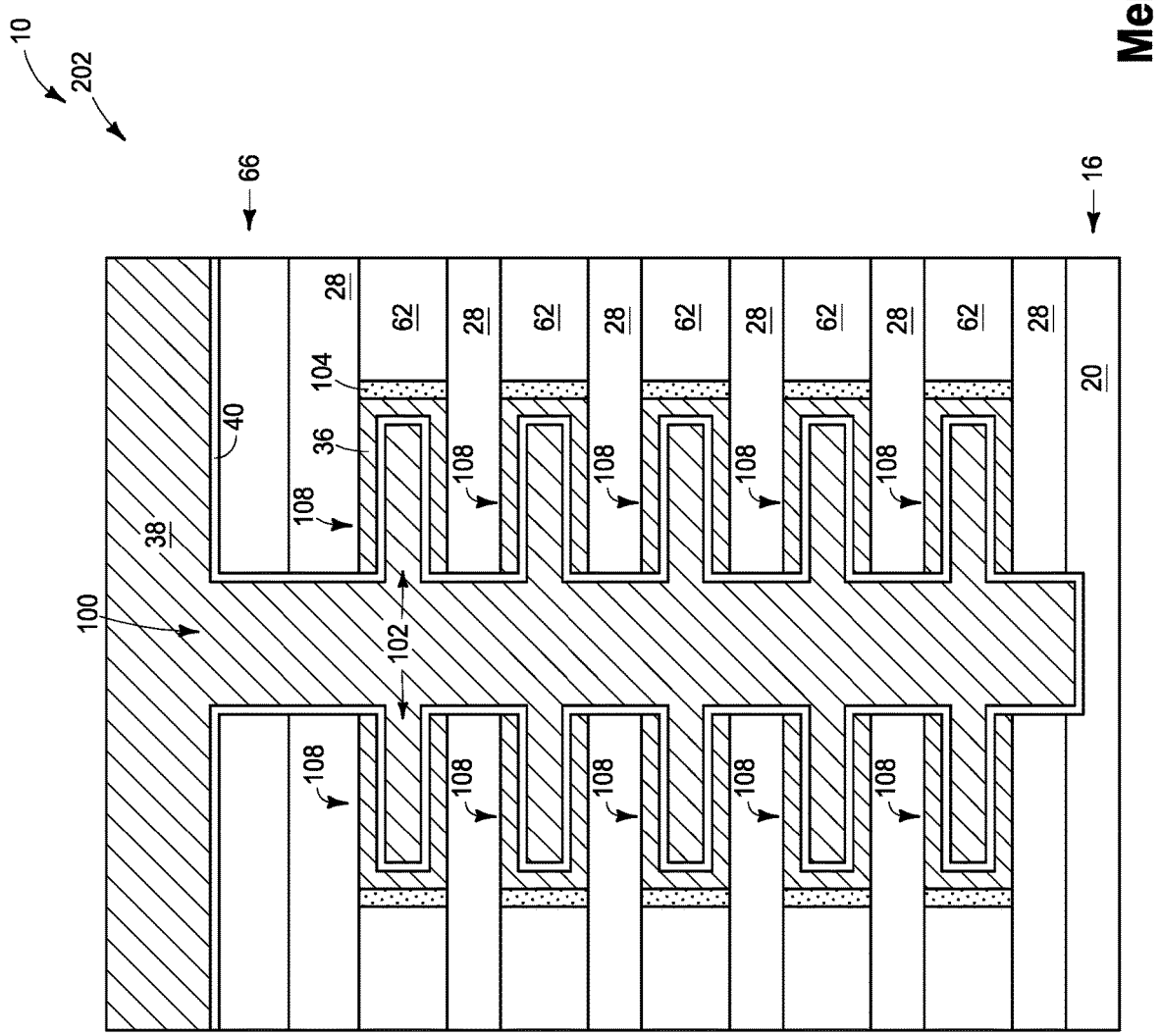
Figure 12B:
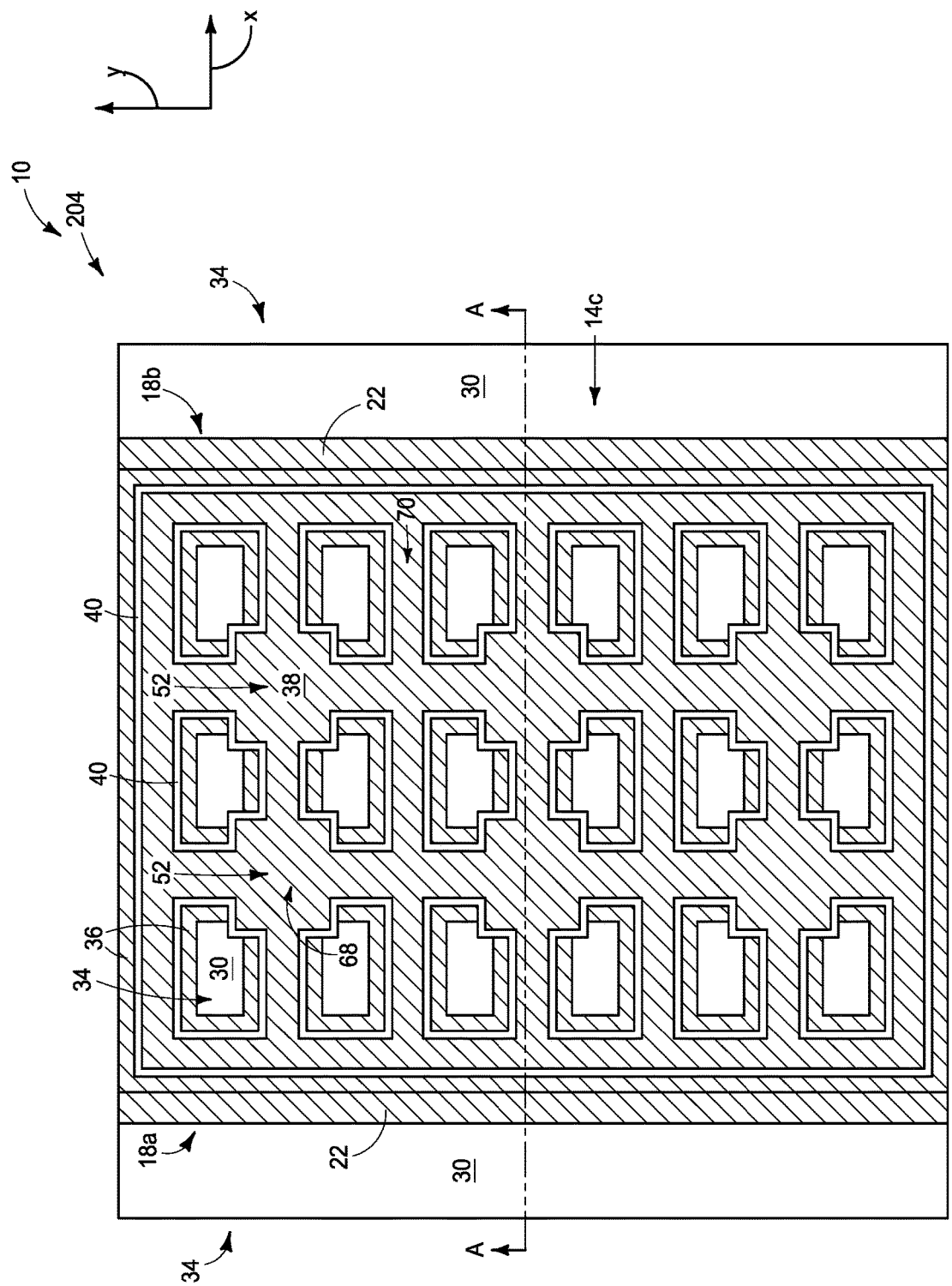

Referring to FIGS. 12A and 12B, the capacitor dielectric material 40 is formed within the conduits 70 to narrow the conduits, and then the second electrode material 38 is formed within the narrowed conduits. The electrode materials 36 and 38, together with the dielectric material 40, form the capacitive tiers 14a-14e along the second levels 60 (the second levels 60 are identified in FIG. 7A). In the shown embodiment, the capacitor dielectric material 40 lines sidewalls of the openings 68 as the capacitor dielectric material is formed within the conduits 70, and the columns 52 of the second electrode material 38 are formed within the openings 68 as the second electrode material is formed within the conduits 70.

The illustrated embodiment has five of the vertically-stacked tiers 14, but other embodiments may have any suitable number of the tiers 14, including, for example, at least eight of the tiers, at least 16 of the tiers, at least 32 of the tiers, at least 64 of the tiers, at least 128 of the tiers, at least 256 of the tiers, at least 512 of the tiers, etc.

FIG. 12A-1 shows that the capacitor dielectric material 40 and the second electrode material 38 extend into the conduits 102. The electrode materials 36 and 38, together with the capacitor dielectric material 40, form laterally-extending capacitors 108; with each of such capacitors comprising the capacitor dielectric material 40 sandwiched between the electrode materials 36 and 38. The capacitors 108 may, for example, correspond to the capacitors 1208 or 1308 described above with reference to FIGS. 1-4. Accordingly, the capacitors of the memory region 202 may be formed simultaneously with the capacitive tiers 14 of the capacitive unit region 204.

Figure 13A:
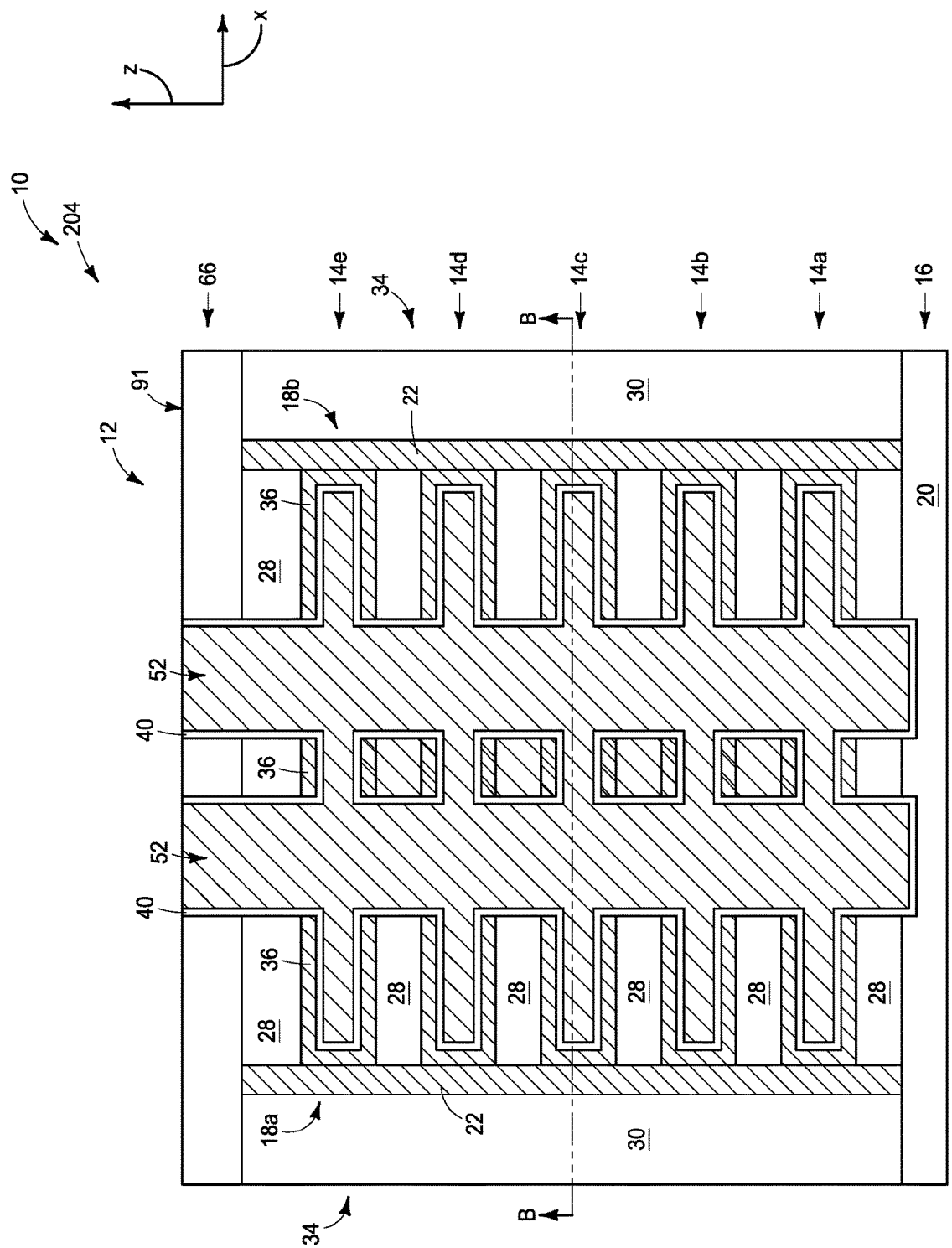
FIGS. 13A and 13B are a diagrammatic cross-sectional side view (FIG. 13A) and a diagrammatic top-down sectional view (FIG. 13B) of the example region of the example integrated assembly of FIGS. 7A and 7B at an example process stage subsequent to that of FIGS. 12A and 12B. The view of FIG. 13A is along the line A-A of FIG. 13B, and the view of FIG. 13B is along the line B-B of FIG. 13A.
Figures 1, 13A:
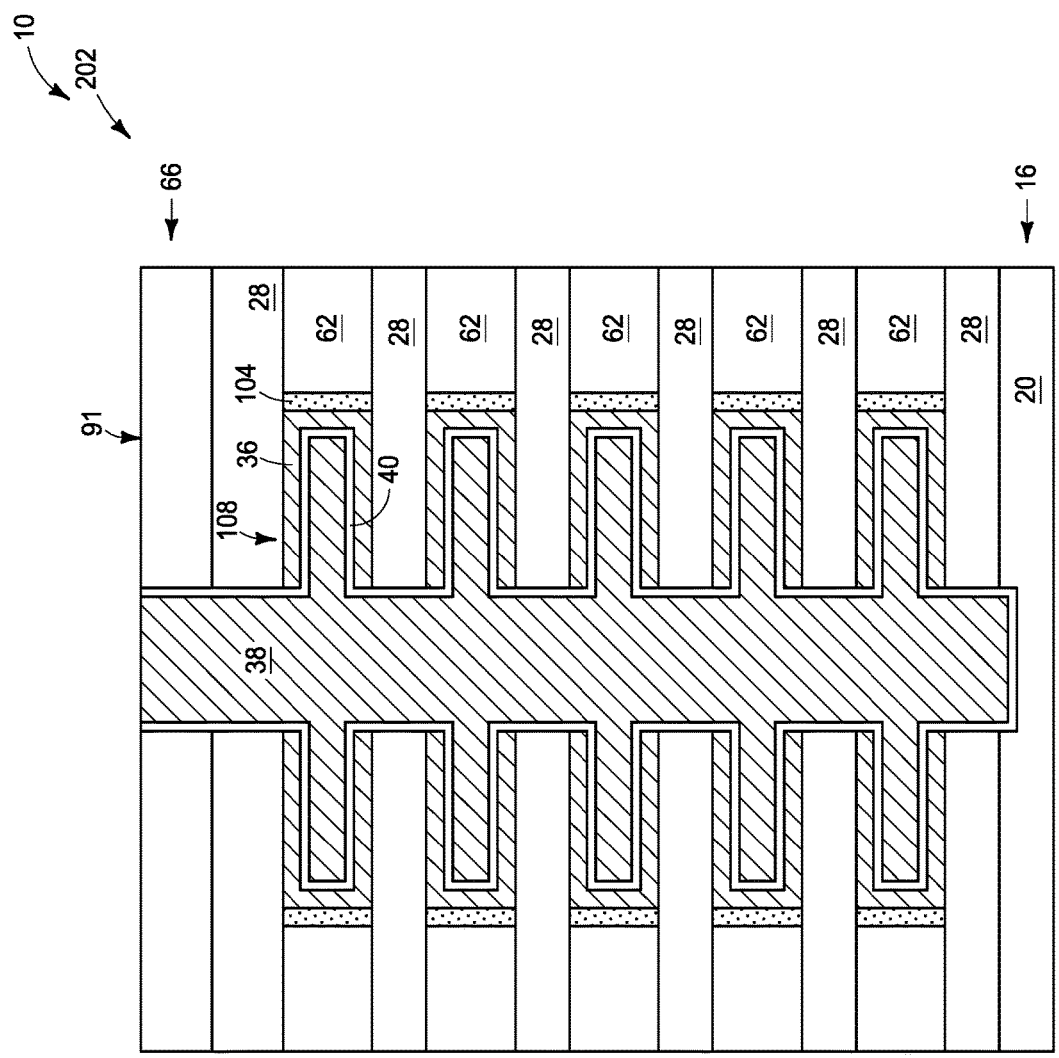

The materials 38 and 40 are shown to be formed over an upper surface of the hard mask material 66 at the process stage of FIGS. 12A and 12A-1. FIGS. 13A and 13A-1 show a subsequent process stage in which the materials 38 and 40 are removed from over the top of the hard mask 66 with a planarization process. The planarization process may utilize any suitable processing, including, for example, CMP. The planarization process forms a planarized upper surface 91.

Figure 13B:
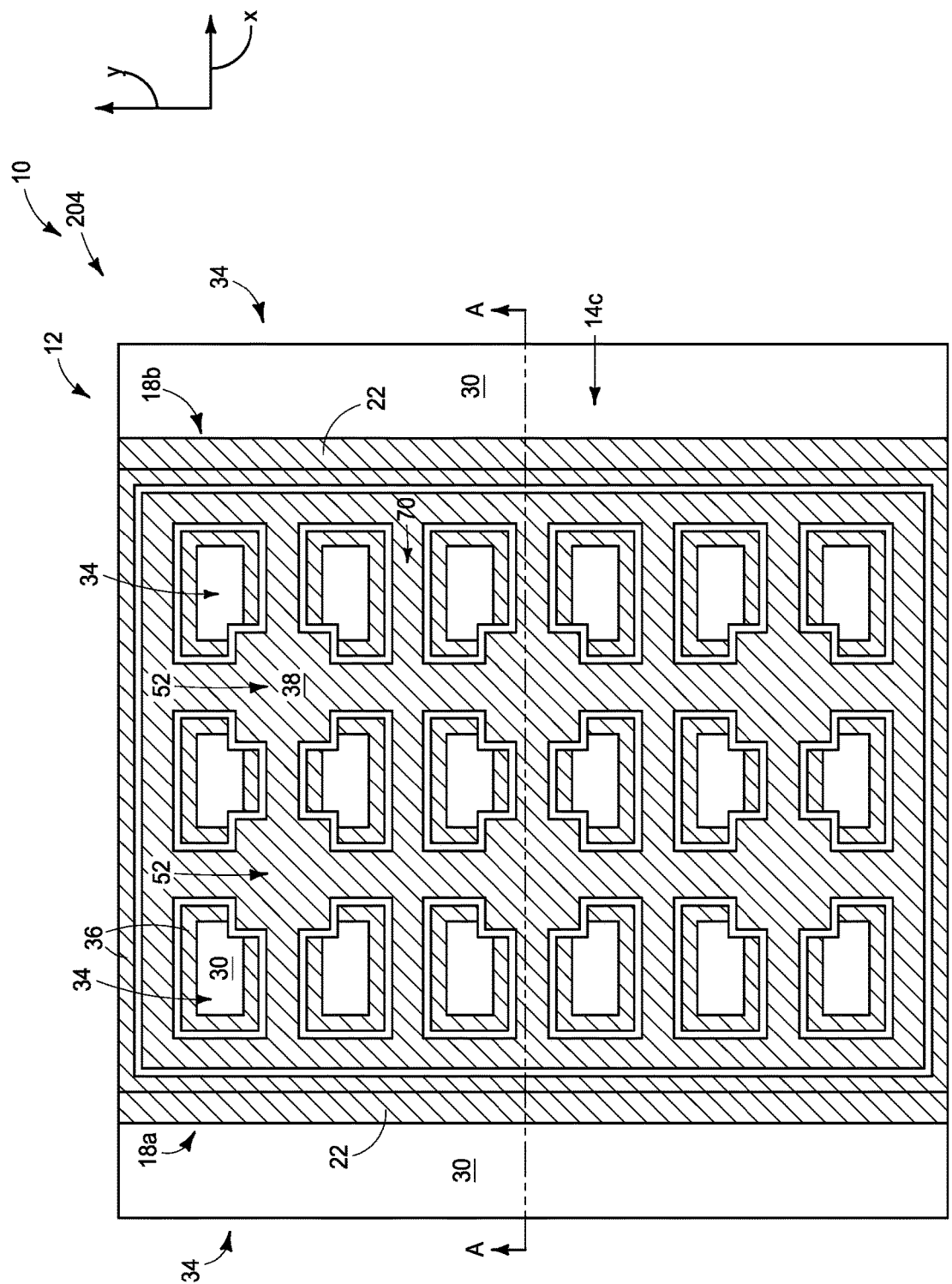

FIG. 13B shows the tier 14c at the process stage of FIG. 13A.

The process stage of FIGS. 13A and 13B comprises a capacitive unit 12 identical to that described above with reference to FIGS. 6A-6C. The process stage of FIG. 13A-1 shows that laterally-extending capacitors 108 of a memory region may have one or more components formed simultaneously with one or more components of the capacitive unit 12.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a capacitive unit having two or more vertically-stacked capacitive tiers. Each of the capacitive tiers has first electrode material arranged in a configuration having laterally-extending first segments and longitudinally-extending second segments. The first and second segments join at intersection-regions. The first electrode material of the first and second segments is configured as tubes. The capacitive tiers are together configured as a stack, with the stack having a first side and having a first vertical edge along said first side. The first electrode material caps the tubes along the first side and is along the first vertical edge. Capacitor dielectric material lines the tubes. Second electrode material extends into the lined tubes. Columns of the second electrode material extend vertically through the capacitive tiers and are joined with the second electrode material within the lined tubes. A conductive plate extends vertically along the first vertical edge of the stack and is directly against the first electrode material.

Some embodiments include an integrated assembly having a memory region comprising vertically-stacked memory capacitors. Each of the memory capacitors includes a capacitor dielectric material sandwiched between a first electrode material and a second electrode material. A capacitive unit is proximate the memory region and comprises a stack which includes vertically-stacked capacitive tiers. Each of the capacitive tiers comprises the first electrode material arranged in a configuration comprising laterally-extending first segments and longitudinally-extending second segments. The first electrode material of the first and second segments is configured as tubes. The stack has a first vertical edge along a first side of the stack. The first electrode material caps the tubes along said first side of the stack and is along the first vertical edge. The capacitive unit comprises capacitor dielectric material lining the tubes. The capacitive unit comprising second electrode material extending into the tubes and being spaced from the first electrode material by at least the capacitor dielectric material. The capacitive unit comprises columns of the second electrode material extending vertically through the capacitive tiers and being joined with the second electrode material within the tubes.

Some embodiments include a method of forming an integrated assembly. A construction is formed to include a stack comprising alternating first and second levels. The second levels comprise sacrificial material. The construction includes insulative pillars extending vertically through the stack, and includes a conductive plate along one side of the stack. Openings are formed to extend vertically through the stack. The sacrificial material of the second levels is exposed along sidewalls of the openings. Conduits are formed along the second levels. The conduits extend around the insulative pillars and extend to a conductive surface of the conductive plate. The forming of the conduits comprises removal of at least some of the sacrificial material. First electrode material is formed within the conduits to line the conduits. The first electrode material is electrically coupled with the conductive plate. Capacitor dielectric material is formed within the lined conduits to narrow the conduits. Second electrode material is formed within the narrowed conduits. The first electrode material, capacitor dielectric material, and second electrode material together form capacitive tiers along the second levels. The capacitive tiers are vertically-stacked one atop another. A capacitive unit comprises the vertically-stacked capacitive tiers.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A capacitive unit, comprising:
two or more vertically-stacked capacitive tiers; each of the capacitive tiers comprising first electrode material arranged in a configuration having laterally-extending first segments and longitudinally-extending second segments; the first and second segments joining at intersection-regions; the first electrode material of the first and second segments being configured as tubes; the capacitive tiers being together configured as a stack, with the stack having a first side and having a first vertical edge along said first side; the first electrode material capping the tubes along the first side and being along the first vertical edge;
capacitor dielectric material lining the tubes;
second electrode material extending into the lined tubes;
columns of the second electrode material extending vertically through the capacitive tiers and being joined with the second electrode material within the lined tubes; and
a conductive plate extending vertically along the first vertical edge of the stack and being directly against the first electrode material.

2. The capacitive unit of claim 1 comprising at least 8 of the capacitive tiers.

3. The capacitive unit of claim 1 comprising at least 32 of the capacitive tiers.

4. The capacitive unit of claim 1 comprising at least 64 of the capacitive tiers.

5. The capacitive unit of claim 1 comprising at least 128 of the capacitive tiers.

6. The capacitive unit of claim 1 wherein the conductive plate is a first conductive plate; wherein the stack has a second side in opposing relation to the first side, with the stack having a second vertical edge along the second side; wherein the first electrode material caps the tubes along the second side of the stack and is along the second vertical edge; and wherein a second conductive plate extends vertically along the second vertical edge of the stack and is directly against the first electrode material.

7. The capacitive unit of claim 6 wherein the stack is a first stack, and further comprising a second stack, substantially the same as the first stack, on an opposing side of the second conductive plate relative to the first stack.

8. The capacitive unit of claim 7 wherein first electrode material within the second stack directly contacts the second conductive plate.

9. The capacitive unit of claim 7 wherein first electrode material within the second stack does not directly contact the second conductive plate.

10. The capacitive unit of claim 1 wherein a first side of the conductive plate is along the first vertical edge of the stack; wherein a second side of the conductive plate is in opposing relation to the first side of the conductive plate; and wherein an entirety of the second side of the conductive plate is directly against a mass of insulative material.

11. The capacitive unit of claim 10 wherein the insulative material comprises one or both of silicon dioxide and silicon nitride.

12. An integrated assembly, comprising:
a memory region comprising vertically-stacked memory capacitors; each of the memory capacitors including a capacitor dielectric material sandwiched between a first electrode material and a second electrode material; and
a capacitive unit proximate the memory region and comprising a stack which includes vertically-stacked capacitive tiers; each of the capacitive tiers comprising the first electrode material arranged in a configuration comprising laterally-extending first segments and longitudinally-extending second segments; the first electrode material of the first and second segments being configured as tubes; the stack having a first vertical edge along a first side of the stack; the first electrode material capping the tubes along said first side of the stack and being along the first vertical edge; the capacitive unit comprising capacitor dielectric material lining the tubes; the capacitive unit comprising second electrode material extending into the tubes and being spaced from the first electrode material by at least the capacitor dielectric material; the capacitive unit comprising columns of the second electrode material extending vertically through the capacitive tiers and being joined with the second electrode material within the tubes.

13. The integrated assembly of claim 12 wherein the capacitive unit includes a conductive plate which extends vertically along the first vertical edge of the stack and which is directly against the first electrode material capping the tubes.

14. The integrated assembly of claim 12 wherein the memory region includes vertically-extending digit lines.

15. The integrated assembly of claim 12 wherein the memory region includes vertically-extending wordlines.

16. The integrated assembly of claim 12 wherein the first electrode material includes a metal nitride.

17. The integrated assembly of claim 12 wherein the first electrode material includes titanium nitride.

18. The integrated assembly of claim 12 wherein the capacitor dielectric material includes silicon dioxide.

19. The integrated assembly of claim 12 wherein the capacitor dielectric material includes one or more high-k compositions.

20. The integrated assembly of claim 12 wherein the second electrode material includes one or more metals.

21. The integrated assembly of claim 12 wherein the second electrode material includes tungsten.

* * * * *